US006670855B2

United States Patent

Sumi

(10) Patent No.: US 6,670,855 B2
(45) Date of Patent: Dec. 30, 2003

(54) PLL DEVICE WITH PLURAL PHASE COMPARATORS

(75) Inventor: Yasuaki Sumi, Tottori (JP)

(73) Assignees: Sanyo Electric Co., Ltd., Osaka-fu (JP); Tottori Sanyo Electric Co., Ltd., Tohori-ken (JP)

(*) Notice: Subject to any disclaimer, the term of this patent is extended or adjusted under 35 U.S.C. 154(b) by 0 days.

(21) Appl. No.: 10/067,712

(22) Filed: Feb. 5, 2002

(65) Prior Publication Data

US 2002/0070812 A1 Jun. 13, 2002

Related U.S. Application Data

(63) Continuation of application No. PCT/JP00/05429, filed on Aug. 11, 2000.

(30) Foreign Application Priority Data

| Aug. 26, 1999 | (JP) | 11-240198 |
| Aug. 31, 1999 | (JP) | 11-245875 |
| Feb. 17, 2000 | (JP) | 2000-039613 |
| Feb. 17, 2000 | (JP) | 2000-039614 |
| Feb. 22, 2000 | (JP) | 2000-044812 |

(51) Int. Cl.[7] ............................................. H03L 7/00
(52) U.S. Cl. ....................... 331/11; 331/DIG. 2; 331/17; 331/1 A
(58) Field of Search .................... 331/DIG. 2, 1 A, 331/17, 11

(56) References Cited

U.S. PATENT DOCUMENTS

| 4,745,372 A | * | 5/1988 | Miwa ............................... 331/8 |
| 5,254,959 A | | 10/1993 | Wünsch |
| 5,475,326 A | | 12/1995 | Masuda |
| 5,856,761 A | * | 1/1999 | Jokura ............................ 331/11 |
| 6,114,888 A | * | 9/2000 | Walley ........................... 327/157 |

FOREIGN PATENT DOCUMENTS

| JP | 05055911 | 3/1993 |
| JP | 05183435 | 7/1993 |
| JP | 10107624 | 4/1998 |
| JP | 10135822 | 5/1998 |

* cited by examiner

Primary Examiner—Arnold Kinkead
(74) Attorney, Agent, or Firm—Cooper & Dunham LLP; William E. Pelton; Donald S. Dowden

(57) ABSTRACT

In a PLL device with a plurality of phase comparators, when one phase comparator has reached a locked state, this phase comparator is allowed to keep on delivering an output, while outputs of the other phase comparators are disabled. Accordingly, power consumption can be reduced. Furthermore, an error current output from a charge pump (109) connected to the phase comparators to output an error signal is reduced when lock approaches. Accordingly, lock failure can be avoided. Furthermore, a time constant of a low-pass filter (220) that receives the output of the charge pumps connected to the phase comparators is altered following alteration of the number of the phase comparators (212 to 219) that deliver their outputs. Accordingly, power consumption can be reduced, and also stability and converging speed are improved. Using distribution means (318) instead of frequency dividers provided for the phase comparators individually makes LSI implementation easy.

13 Claims, 17 Drawing Sheets ation of PCT International Application No. PCT/JP00/05429, filed Aug. 11, 2000, designating the United States of America, the contents of which are incorporated by reference into the present invention.

BACKGROUND OF THE INVENTION

1. Field of the Invention

The present invention relates to a PLL device.

2. Background Art

An example of a PLL device of this type is shown for example in the drawing at page 32 of "SANYO TECHNICAL REVIEW" Vol. 10, No. 1, February 1978. This PLL device includes a reference oscillator generating a reference signal RF, a variable frequency divider dividing the frequency of an output signal FO to generate a feedback signal FV, and one phase comparator comparing the phase and frequency of the feedback signal FV with the phase and frequency of the reference signal FR to generate an error signal ER. Also provided are a low-pass filter generating a control voltage CV in response to the error signal ER, and a voltage-controlled oscillator generating the output signal FO in response to the control voltage CV.

However, this device has a disadvantage of having a long lock-up time (the time until synchronization with the output signal is reached), since it is a single-stage phase comparator type (the type using only one (single stage) phase comparator) and therefore, phase comparison is performed only once during one period of the reference signal.

Japanese Unexamined Patent Publication No. 10-135822 has been proposed to remove such disadvantage. According to this publication, there is provided a generating means for generating a plurality of reference signals having mutually differing phases, a plurality of (four, for example) frequency dividers dividing the frequency of the output signal of a voltage-controlled oscillator, a plurality of phase comparators comparing feedback signals from the frequency dividers with the reference signals, and a plurality of gates disposed at input sides of the frequency dividers.

However, the lock-up time is not shortened much even with the above configuration. The inventor of this application tried to track down the cause, and found it to be interference between outputs of the phase comparators when lock approached, which prevented smooth establishment of lock.

The inventor tried having the phase comparators deliver outputs initially, and then having one phase comparator deliver an output.

The inventor also tried out a configuration in which a value of a current of an error signal is switched at a certain timing during start-up.

However, it was found that the locking time A (FIG. 1) was not shortened much as shown in FIG. 1 in either of the above-described configurations. FIG. 1 shows a start-up characteristic in which the horizontal axis represents a time (elapsed time), and the vertical axis represents a frequency FO of an output signal.

The inventor tried to track down the cause, and found it to be that the time B at which the number of output stages of the phase comparators is switched is too early, and therefore, frequency fluctuation (lock failure) C arises.

Moreover, the device disclosed in the Japanese Unexamined Patent Publication No. 10-135822 has a disadvantage of having insufficient stability for a PLL loop, and low converging speed for the output signal.

The inventor tried to track down the cause, and found it to be that the principal parameters of the PLL loop (angular frequency, damping factor, cut-off frequency and so on) when one stage of the phase comparator and those when 4 stages of the phase comparators are used are the same.

Furthermore, the device disclosed in the Japanese Unexamined Patent Publication No. 10-135822 has a disadvantage of having large power consumption. The inventor tried to track down the cause, and found it to be the provision of frequency dividers.

If phase comparisons are performed four times during one period of the reference signal to further shorten the lock-up time, four frequency dividers are needed, and accordingly power consumption increases still more.

In addition, it has a third disadvantage that, because of use of a plurality of frequency dividers requiring a relatively large space, the device becomes large in size, the cost increases, and LSI implementation becomes difficult.

Accordingly, an object of the present invention in view of such conventional disadvantages is to provide a PLL device that has a short lock-up time, no interference between outputs of the phase comparators, no lock failure, and a small power consumption.

Another object of the present invention is to provide a PLL device that has a short lock-up time and no lock failure.

Still another object is of the present invention is to provide a PLL device that has a short lock-up time, superior stability and converging speed, and a small power consumption. Yet another object of the present invention is to provide a PLL device that has a short lock-up time and a small power consumption, and that is less expensive and easy to implement in an LSI.

DISCLOSURE OF THE INVENTION

A PLL device of a first aspect of the invention includes a generating means (2, 3, 4, 5) for generating a plurality of reference signals having mutually differing phases, a plurality of variable frequency dividers (11, 12, 13, 14) that divide a frequency of an output signal of a voltage-controlled oscillator (15) to generate feedback signals, a plurality of phase comparators (7, 8, 9, 10) that compare phases between the reference signals and the feedback signals, and a control unit (30), wherein the control unit (30) allows, when deciding that a locked state has been reached in at least one of the phase comparators, this one of the phase comparators to keep on delivering an output thereof, and disables outputs of the other phase comparators.

A PLL device of a second aspect of the invention includes a generating means (2, 3, 4, 5) for generating a plurality of reference signals having mutually differing phases, a plurality of variable frequency dividers (11, 12, 13, 14) that divide a frequency of an output signal of a voltage-controlled oscillator (15) to generate feedback signals, a plurality of phase comparators (7, 8, 9, 10) that compare phases between the reference signals and the feedback signals, and a control unit (30), wherein the control unit (30) allows, when deciding that at least one of the phase comparators is in a nearly locked state, one of the phase comparators to keep on delivering an output thereof, and disables outputs of the other phase comparators.

A PLL device of a third aspect of the invention includes a generating means (2, 3, 4, 5) for generating a plurality of reference signals having mutually differing phases, a plurality of variable frequency dividers (11, 12, 13, 14) that divide a frequency an output signal of a voltage-controlled oscillator (15) to generate feedback signals, a plurality of phase comparators (7, 8, 9, 10) that compare phases between the reference signals and the feedback signals, and a control unit (30), wherein the control unit (30) allows one of the phase comparators to keep on delivering an output thereof, and disables outputs of the other phase comparators after a lapse of a predetermined time (S14) after a start signal or a frequency alteration command is input.

In the PLL device of the first, second or third aspect, it is permissible for the control unit (30) to have the variable frequency divider connected to the phase comparator that keeps on delivering its output continue to operate, and have the other variable frequency dividers stop their operations.

The PLL device of the first or second aspect may further include detectors (37, 38, 39, 40) connected to the phase detectors for detecting the locked state or the nearly-locked state on the basis of the outputs of the phase comparators and outputting a detection signal to the control unit.

A PLL device of a fourth aspect of the invention includes a generating means (2, 3, 4, 5) for generating a plurality of reference signals having mutually differing phases, a single divider or a plurality of variable frequency dividers (11, 12, 13, 14) dividing a frequency of an output signal of a voltage-controlled oscillator (15) to generate feedback signals, a single phase comparator or a plurality of phase comparators (7, 8, 9, 10) comparing phases between the reference signals and the feedback signals to output a plurality of phase comparison signals, and a control unit (30), wherein the control unit lets a plurality of the phase comparison signals be output normally, and switches to let one of the phase comparison signals be output when the state is nearly locked.

In the PLL device of the fourth aspect, it is permissible to make decision that the state has been nearly locked when the frequency of the output signal has reached a predetermined percentage of the upper limit of the frequency bounds within which the state is judged as being locked after overshoots and down shoots are over.

In this case, it is advantageous to set the predetermined percentage between 70% and 95%, and it is more advantageous to set it between 85% and 95%.

A PLL device of a fifth aspect of the invention includes a variable frequency divider (103) that divides a frequency of an output signal of a voltage-controlled oscillator (102) to generate a feedback signal, at least one phase comparator (106) that compares phases between the feedback signal and a reference signal, a charge pump (109) that outputs an error signal (ER) in accordance with a phase comparison signal from the phase comparator, a low-pass filter (110) into which the error signal is input, and a control unit (104) that causes a current of the error signal to switch when the state is nearly locked.

It is permissible that the PLL device of the fifth aspect further comprises a detection means (119) for detecting the nearly locked state, and the control unit (104) causes the charge pump (109) to switch the current of the error signal when the detection means (119) detects the nearly locked state.

In this case, it is permissible to make decision that the state has been nearly locked when the frequency of the output signal has reached a predetermined percentage of the upper limit of the frequency bounds within which the state is judged as being locked after overshoots and down shoots are over.

It is advantageous to set the predetermined percentage between 70% and 95%, and it is more advantageous to set it between 85% and 95%.

A PLL device of a sixth aspect of the invention includes a plurality of frequency dividing units (230, 231, 260) that divide a frequency of an output signal of a voltage-controlled oscillator (229) to generate feedback signals (fv1 to fv8), a plurality of phase comparators (212 to 219) that compare phases between the feedback signals (fv1 to fv8) and the reference signals (fR1 to fR8) to output error signals (ER1 to ER8) through charge pumps (221 to 228), a low-pass filter (221) that converts the error signals (ER1 to ER8) into a control voltage (CV) to be output to the voltage-controlled oscillator (229), and a control unit (258), wherein the control unit (258) is capable of causing the phase comparators to deliver outputs or to disable outputs of the phase comparators, and alters a time constant of the low-pass filter depending on the number of the phase comparators that are caused to deliver outputs.

In the PLL device of the sixth aspect, it is permissible for the control unit to cause the frequency dividing unit connected to the phase comparator that is delivering its output to operate, and causes the other frequency dividing units to stop their operations.

It is also permissible for the control unit to have all of the phase comparators deliver their outputs until the PLL device is locked, and have some of the phase comparators deliver their outputs after lock.

It is also permissible to alter the cut-off frequency of the low-pass filter when the control unit alters the time constant.

It is also permissible that a reference signal generating means capable of generating a plurality of reference signals having mutually differing phases and of selecting the number of the reference signals to be generated is provided, and the control unit determines the cut-off frequency following the selection of the number of the reference signals to be subjected to the phase comparisons.

It is also permissible to configure the low-pass filter to alter its gain when the control unit alters the time constant.

A PLL device of a seventh aspect of the invention includes a generating means (302, 304, 305, 306) for generating a plurality of reference signals having mutually differing phases, a variable frequency divider (317) that divides a frequency of an output signal of a voltage-controlled oscillator (316), a distribution means (318) for distributing the output of the voltage-controlled oscillator (316), and phase comparators (307 to 310) that compares phases between feedback signal (FV1 to FV4) output from the variable frequency divider (317) and the distribution means (318) and the reference signal (FR1 to FR4), and output a plurality of phase comparison signals.

In the PLL device of the seventh aspect, it is permissible that the distribution means (318) includes a counter (320) and/or a programmable frequency divider (319).

It is permissible that at least one variable frequency divider (319) and at least one counter (320) are provided.

It is also permissible that the distribution means (318) outputs a plurality of the feedback signals (FR2 to FR4), and the phase comparators (308 to 310) connected to the distribution means output a plurality of the phase comparison signals (ER2 to ER4).

It is also permissible to have the variable frequency divider and the distribution means operate initially, and allow only the variable frequency divider to keep on operating when lock is approaching.

BEST MODES OF PRACTICING THE INVENTION

Embodiments of the invention will now be described with reference to the drawings.

A First Embodiment

Figure 2:
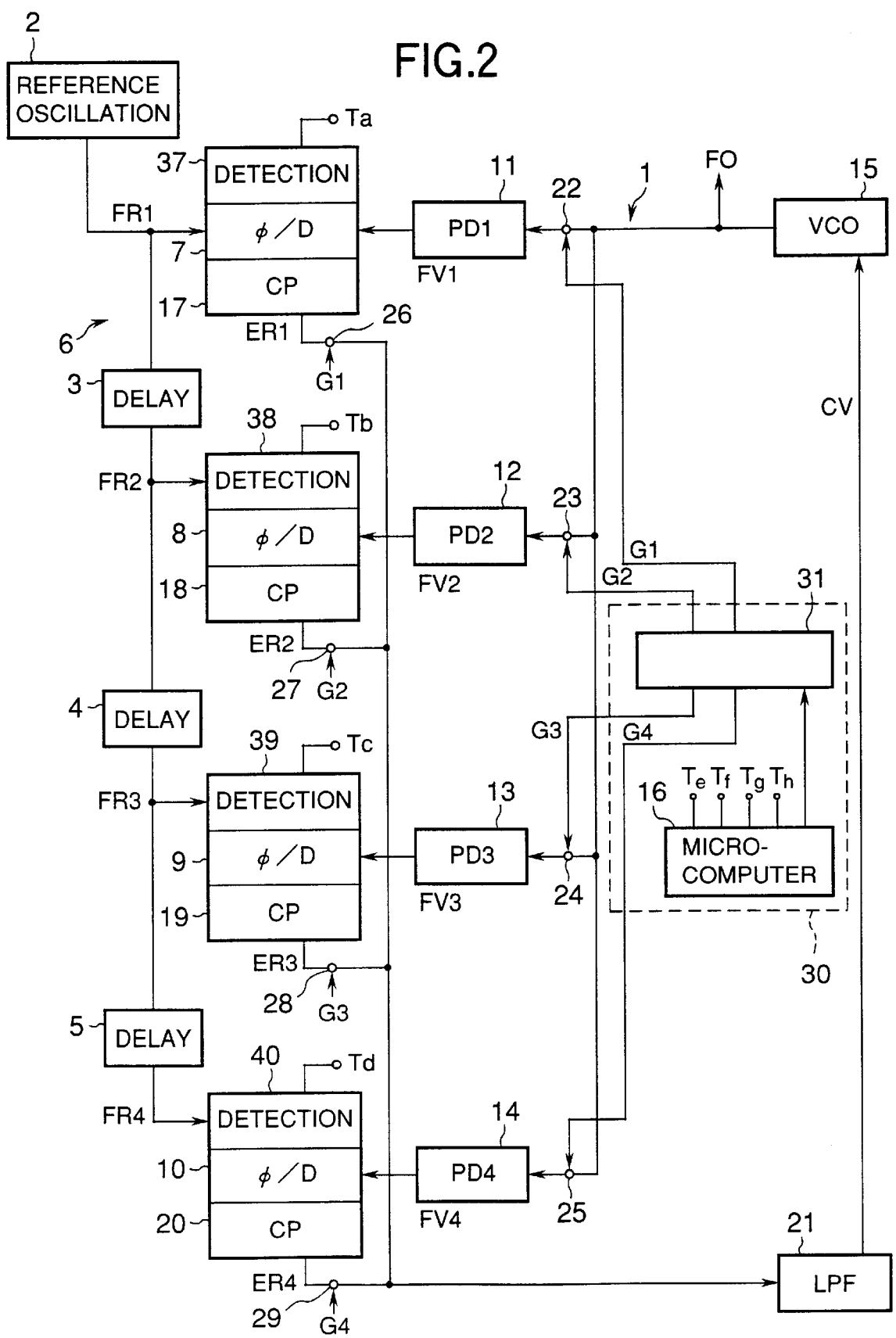
FIG. 2 is a block diagram showing a PLL device according to a first embodiment of the invention.

A PLL device 1 according to a first embodiment of the invention will be explained in accordance with a block diagram of FIG. 2. In FIG. 2, a reference oscillator 2 outputs a reference signal FR1. Delay circuits 3, 4, and 5 generate a plurality of reference signals FR2, FR3, FR4 having mutually differing phases in response to the reference signal FR1. The reference oscillator 2 and the delay circuits 3, 4, 5 form a reference-signal generating means 6.

To be more specific, the reference signal FR1 is input into a phase comparator 7. The delay circuit 3 delays the reference signal FR1 by ¼ of the period of the reference signal FR1, and outputs it to a phase comparator 8 as the reference signal FR2. The delay circuit 4 delays its input by ¼ period to output a signal that lags behind the reference signal FR1 by ½ period to a phase comparator 9 as the reference signal FR3. The delay circuit 5 delays its input by ¼ period to output a signal that lags behind the reference signal FR1 by ¾ period to a phase comparator 10 as the reference signal FR4.

Variable frequency dividers 11, 12, 13, 14 whose inputs are connected to the output of a voltage-controlled oscillator 15 each perform frequency division by integer ratios.

Figure 3:
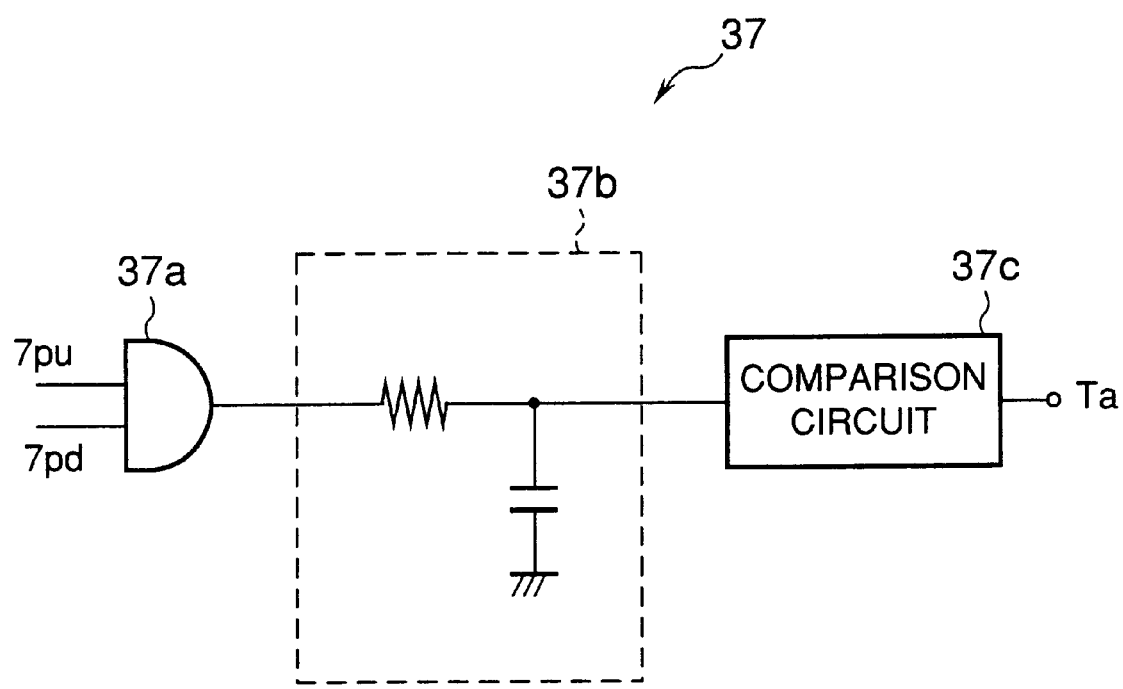
FIG. 3 is a circuit diagram showing details of a detector of FIG. 2.

The phase comparator 7 compares the phase and frequency of the output (feedback signal FV1) of the variable frequency divider 11 with the phase and frequency of the reference signal FR1. The phase comparator 7 delivers a pump-up signal 7pu and a pump-down signal 7pd to two output terminals (not shown) as a result of the comparison. A detector 37 has an AND gate 37a, a pulse-width/voltage conversion circuit 37b, and a comparison circuit 37c as shown in FIG. 3. When the feedback signal FV1 matches the reference signal FR1 in their frequencies and phases, the pump-up signal 7pu and the pump-down signal 7pd are at a high level.

The AND gate 37a takes a logical AND of the pump-up signal 7pu and the pump-down signal 7pd, and this logical AND signal is converted into a voltage signal by the pulse-width/voltage conversion circuit 37b, this voltage signal being compared with a predetermined threshold in the comparison circuit 37c to deliver a signal representing a result of the comparison to a microcomputer 16 through terminals Ta and Te as a detection signal.

The microcomputer 16 has a central processing unit, a program memory and a data memory which are not illustrated. This central processing unit operates in accordance with a program stored in the program memory by storing data in the data memory.

The pump-up signal 7pu and the pump-down signal 7pd are also input into a charge pump 17, and the charge pump 17 generates an error signal ER1 based on them.

Likewise, the phase comparator 8 compares the phase and frequency of the feedback signal FV2 from the variable frequency divider 12 with the phase and frequency of the reference signal FR2. The phase comparator 8 outputs the pump-up signal and the pump-down signal to a detector 38 as a result of the comparison, and the detector 38 (configured in the same way as the detector 37) generates a detection signal based on both of the above signals, and outputs it to the microcomputer 16 through terminals Tb and Tf. A charge pump 18 receives the pump-up signal and pump-down signal, and outputs an error signal ER2.

The phase comparator 8 compares the phase and frequency of the feedback signal FV3 of the variable frequency divider 13 with the phase and frequency of the reference signal FR3. The phase comparator 9 outputs the pump-up signal and pump-down signal to a detector 39 as a result of the comparison, and the detector 39 (configured in the same way as the detector 37) generates a detection signal based on both of the above signals, and outputs it to the microcomputer 16 through terminals Tc and Tg. A charge pump 19 receives the pump-up signal and pump-down signal, and outputs an error signal ER3.

The phase comparator 10 compares the phase and frequency of the feedback signal FV4 from the variable frequency divider 14 with the phase and frequency of the reference signal FR4. The phase comparator 10 outputs the pump-up signal and pump-down signal to a detector 40 as a result of the comparison, and the detector 40 (configured in the same way as the detector 37) generates a detection signal based on both the above signals, and outputs it to the microcomputer 16 through terminals Td and Th. A charge pump 20 receives the pump-up signal and pump-down signal, and outputs an error signal ER4.

In this manner, the phase comparators 7 to 10 output a plurality of (four in this embodiment) phase-comparison-result signals (each comprising a pump-up signal and a pump-down signal). The phase comparators 7 to 10 compare phases between the reference signals FR1 to FR4 and the feedback signals FV1 to FV4, and based on the results of the phase comparisons, the error signals ER1 to ER4 are generated.

A low-pass filter 21 outputs a control voltage CV to the voltage-controlled oscillator 15 in response to the error signals ER1 to ER4 from the charge pumps 17 to 20 connected to the phase comparators 7 to 10. The voltage-controlled oscillator 15 generates an output signal FO in response to the control voltage CV.

A gate 22 is disposed between the output of the voltage-controlled oscillator 15 and the input of the variable frequency divider 11. A gate 23 is disposed between the output of the voltage-controlled oscillator 15 and the input of the variable frequency divider 12. A gate 24 is disposed between the output of the voltage-controlled oscillator 15 and the input of the variable frequency divider 13. A gate 25 is disposed between the output of the voltage-controlled oscillator 15 and the input of the variable frequency divider 14.

Similarly, a gate 26 is disposed between the output of the charge pump 17 and the input of the low-pass filter 21. A gate 27 is disposed between the output of the charge pump 18 and the input of the low-pass filter 21. A gate 28 is disposed between the output of the charge pump 19 and the input of the low-pass filter 21. A gate 29 is disposed between the output of the charge pump 20 and the input of the low-pass filter 21.

A control unit 30 includes the microcomputer 16 and a gate control circuit 31 for example. The gate control circuit 31, which is for outputting control signals G1, G2, G3, G4 in accordance with the signals from the microcomputer 16 and the reference signals FR1 to FR4 input thereto, is comprised of a logic circuit.

The control signal G1 is supplied to the gates 22 and 26, the control signal G2 is supplied to the gates 23 and 27, the control signal G3 is supplied to the gates 24 and 28, and the control signal G4 is supplied to the gates 25 and 29.

Figure 4:
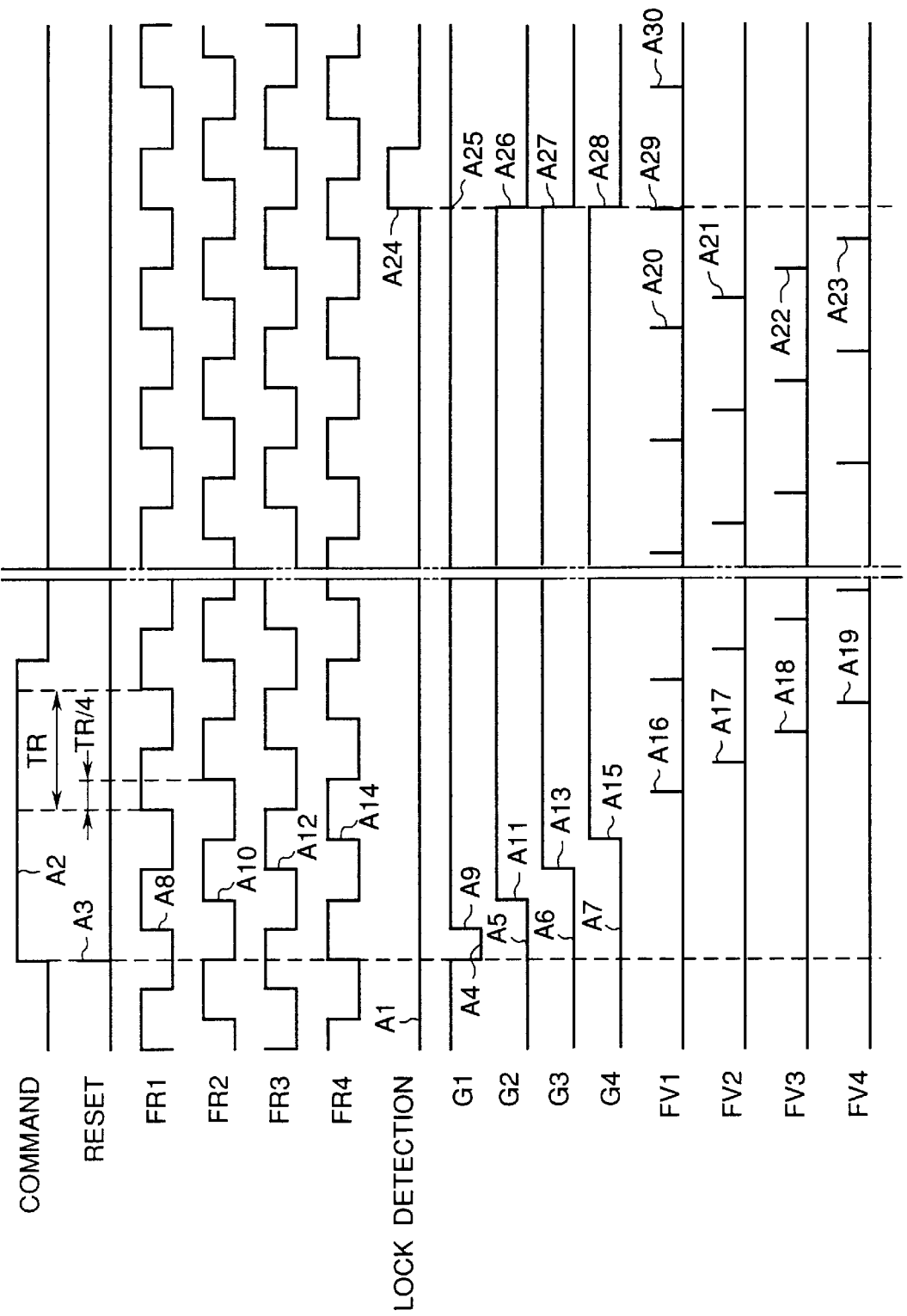
FIG. 4 is a timing diagram of signals that appear in various parts of the PLL device according to the first embodiment.

The operation of this PLL device 1 will now be explained with reference to FIG. 2 to FIG. 4. FIG. 4 is a timing diagram of the signals used in the PLL device 1. In these Figs, shown is a case where a user selects a frequency of 300 kHz for example by a channel selection key, presses a start key to output an output signal of 300 kHz, and thereafter, changes the frequency to 500 kHz for example by the channel selection key.

Suppose that the state is locked onto 300 kHz initially where the control signal G1 is on, the control signal G2, G3, G4 are off, and only the phase comparator 7 is operating to keep the state locked. The detectors 37 to 40 output the detection signal when the state is locked, however, since this signal is of the one-shot type (a signal that is at the high level only during a certain time), it is at the low level at the time A1 (see FIG. 4).

Suppose that the user manipulates the channel selection key to change from 300 kHz to 500 kHz. In accordance with this change, a frequency alteration command is input into the gate control circuit 31.

This command is a one-shot type signal (a signal which remains high for a short period of time, and then goes low; see A2 in FIG. 4). At this time, the control signal G1 which the gate control circuit 31 outputs changes from the high level to the low level, and is maintained at the low level until a certain time elapses (see A4 in FIG. 4). Likewise, the control signals G2, G3, G4 are maintained in the low level state (see A5, A6, A7 in FIG. 4) for a certain time after a reset signal is output (A3 in FIG. 4). At this time, since the gates 22 to 25 are in the off-state, the output signal FO is not output to the variable frequency dividers 11 to 14. The frequency dividers 11 to 14 do not perform frequency division operations. Since the gates 26 to 29 are in the off-state as well, the error signals ER1 to ER4 are not output to the low-pass filter 21.

In this way, the control unit 30 resets the variable frequency dividers 11 to 14 before the variable frequency dividers 11 to 14 start frequency division operations. The gate control circuit 31 allows the control signal G1 to rise (A9) in synchronization with the rise of the reference signal FR1 (A8), and accordingly, the gate 22 turns on, so that the output signal FO is output to the variable frequency divider 11 and the variable frequency divider 11 starts the frequency division operation. The gate 26 turns on in synchronization with the rise of the control signal G1 (A9), and the phase comparator 7 compares phases between the output signal divided by the variable frequency divider 11 or the feedback signal FV1 (see A16 in FIG. 4), and the reference signal FR1 to output the error signal ER1.

Likewise, the control signal G2 rises (A11) in synchronization with the rise of the reference signal FR2 (A10), and accordingly the gate 23 turns on, so that the output signal FO is output to the variable frequency divider 12 and the variable frequency divider 12 starts the frequency division operation. The gate 27 turns on in synchronization with the rise of the control signal G2 (A11), and the phase comparator 8 compares phases between the output signal divided by the variable frequency divider 12 or the feedback signal FV2 (see A17 in FIG. 4), and the reference signal FR2 to output the error signal ER2.

The control signal G3 rises (A13) in synchronization with the rise of the reference signal FR3 (A12), and accordingly, the gate 24 turns on, so that the output signal FO is output to the variable frequency divider 13 and the variable frequency divider 13 starts the frequency division operation. The gate 28 turns on in synchronization with the rise of the control signal G3 (A13), and the phase comparator 9 compares phases between the feedback signal FV3 (see A18 in FIG. 4) and the reference signal FR3 to output the error signal ER3.

The control signal G4 rises (A15) in synchronization with the rise of the reference signal FR4 (A14), and accordingly the gate 25 turns on, so that the output signal FO is output to the variable frequency divider 14 and the variable frequency divider 14 starts the frequency division operation. The gate 29 turns on in synchronization with the rise of the control signal G4 (A15), and the phase comparator 10 compares phases between the feedback signal FV4 (see A19 in FIG. 4) and the reference signal FR4 to output the error signal ER4.

In this way, the control unit 30 causes the variable frequency dividers 11 to 14 to start the frequency division operation in conformity with the phases of the reference signals FR1 to FR4 (the rises A8, A10, A12, A14 for example).

As described above, the reference oscillator 2 generates the reference signal FR1 having the reference frequency FR (period TR=1/FR). Delaying the reference signal FR1 sequentially by ¼ period (TR/4) through the delay circuits 3, 4, 5 forms the reference signals FR2, FR3, FR4.

The starting times of the frequency division operations by the variable frequency dividers 11, 12, 13, 14 are in conformity with the phases of the reference signals FR1, FR2, FR3, FR4. The starting times of the frequency division operations are therefore sequentially delayed in steps of TR/4, so the phase comparison timings in the phase comparators 7, 8, 9, 10 are delayed in steps of TR/4.

Having the variable frequency dividers 11 to 14 start the frequency division operations in conformity with the phases of the reference signals FR1 to FR4 thus equalizes the intervals between the phase comparison timings of the phase comparators 7 to 10, enabling accurate phase comparisons.

As described above, the reference signals FR1 to FR4 have different phases (in this embodiment, their phases are mutually offset in steps of p/2), and phase comparison is performed for each of the reference signals FR1 to FR4. As a result, phase comparisons are performed multiple times during one period (TR) of the reference signal FR1 (four times at A16, A17, A18, A19 in this embodiment), so the lock-up time is shortened to approximately ¼ of the conventional time.

As time elapses and the above phase comparisons are repeated (see A20, A21, A22, A23 in FIG. 4), the output signal FO reaches (locks onto) the set frequency. Then, the detector 37, 38, 39, or 40 coupled to one of the phase comparators 7, 8, 9, 10 outputs a detection signal to the microcomputer 16. Suppose that the detector 37 has detected a lock. The microcomputer 16 outputs a lock detection signal to the gate control circuit 31 (see A25 in FIG. 4; the lock detection signal is of the one-shot type).

At this time, the control signals G2, G3, G4 become low level signals (see A26, A27, A28 in FIG. 4). The control signal G1 is maintained in the high level state (see A25 in FIG. 4).

As a result, the gates 23, 24, 25 turn off, and the variable frequency dividers 12, 13, 14 stop the frequency division operations. At this time, the gates 27, 28, 29 under control of the control signals G2, G3, G4 also turn off. Thus, the outputs of the phase comparators 27, 28, 29 are disabled. As a result, the error signal ER2, ER3, ER4 are not output to the low-pass filter 21. As described above, since the variable frequency dividers 12, 13, 14 stop the frequency division operations after detection of the lock, power consumption can be reduced.

Since the control signal G1 is maintained in the high level state, the gate 22 and the gate 26 continue to be in the on-state, so the variable frequency divider 11 keeps on performing the frequency division operation. The phase comparator 7 compares phases between the feedback signal FV1 output from the variable frequency divider 11 and the reference signal FR1 (see A29 and A30 in FIG. 4).

At this time, since the gate 26 under control of the control signal G1 is in the on-state, the charge pump 17 outputs the error signal ER1 to the low-pass filter 21. The low-pass filter 21 outputs the control signal CV to the voltage-controlled oscillator 15, and the voltage-controlled oscillator 15 keeps on delivering the output signal FO that has reached the set frequency. Thus, the locked phase comparator 7 keeps on delivering its output.

The above material is summarized as follows. Suppose that at least one (37, for example) of the detectors 37 to 40 connected to the phase comparators 7, 8, 9, 10 has detected a lock. The detector 37 outputs a lock detection signal to the microcomputer 16 of the control unit 30.

The control unit 30 causes the locked phase comparator 7 to keep on delivering the output (see A25 in FIG. 4) and disables the outputs of the other phase comparators 8, 9, 10.

Concurrently with the above operations, the control unit 30 causes only the variable frequency divider 11 connected to the phase comparator 7 keeping on delivering the output to continue the frequency division operation. The control unit 30 causes the other variable frequency dividers 12, 13, 14 to stop their frequency division operations.

A Second Embodiment

A PLL device according to a second embodiment of the invention has the same circuit configuration as the PLL device 1 according to the first embodiment. However, the control unit 30, especially its microcomputer 16 operates differently.

Figure 5:
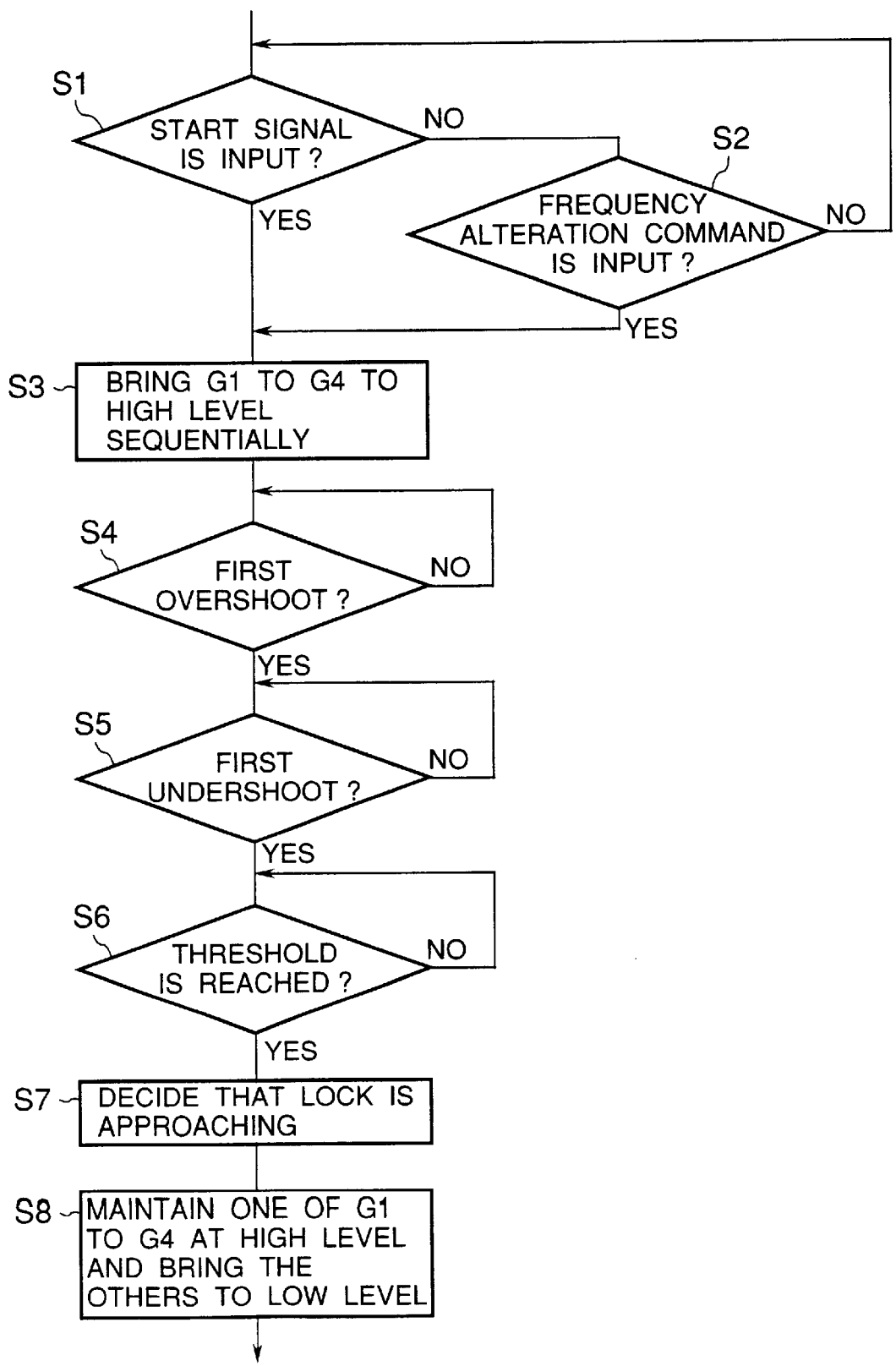
FIG. 5 is a flowchart showing the operation of a PLL device according to a second embodiment of the invention.

Its operation will be explained with reference to FIG. 5.

In a PLL device 32, when a start signal is input (S1), or when a frequency alteration command is input (S2), the signals G1 to G4 are brought to the high level sequentially in steps of TR/4, so that a group of the gates 22 and 26, a group of the gates 23 and 27, a group of the gates 24 and 28, and a group of the gates 25 and 29 turn on sequentially at the timings shifted in steps of TR/4 (S3). As a result, the variable frequency dividers 11, 12, 13, 14 divide the frequency of the output signal FO and output the feedback signals. The phase comparators 7 to 10 initially compare phases between the feedback signals and the reference signals and output a plurality of phase comparison signals so that error signals are output to the low-pass filter 21 through the charge pumps 17 to 20.

At this time, the detectors 37 to 40 each take logical ANDs of the pump-up signals and the pump-down signals output from the phase comparators 7 to 10 and convert them into voltage signals so that detection signals obtained through comparisons with a predetermined threshold are output to the microcomputer 16.

Figure 6:
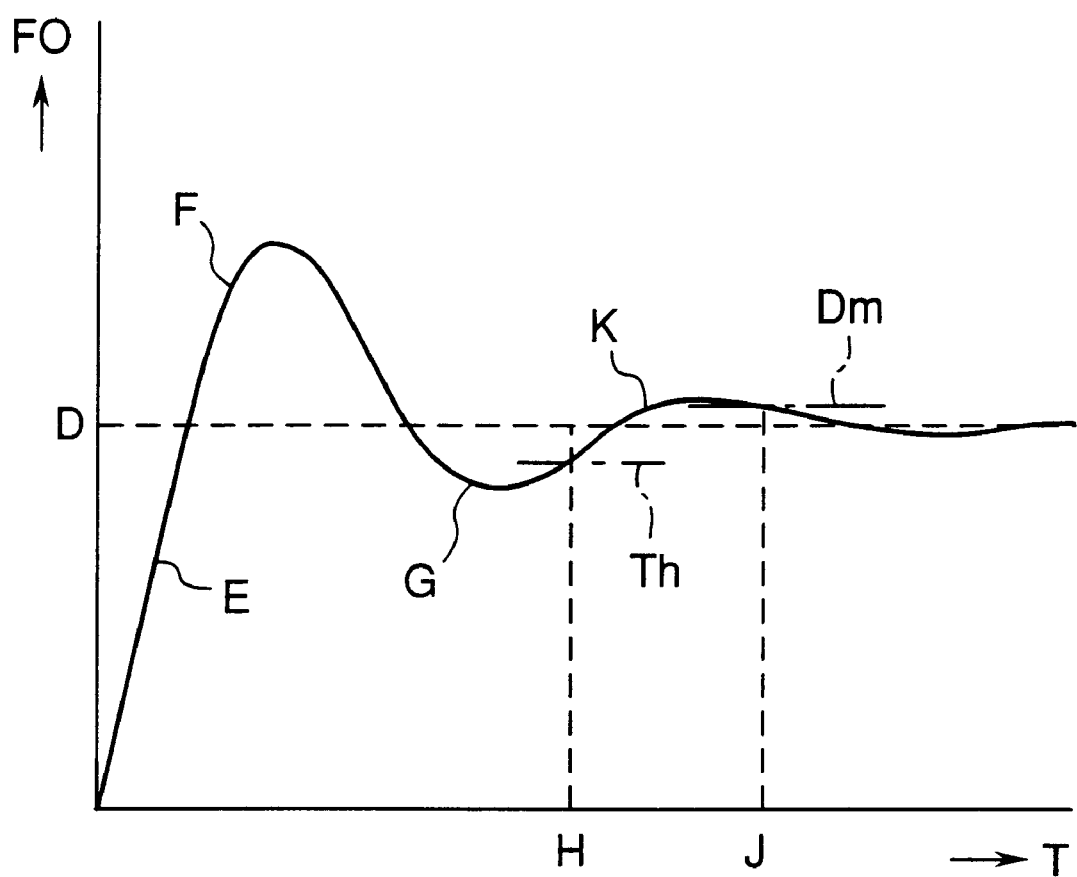
FIG. 6 is a view showing a start-up characteristic of an output signal of a voltage-controlled oscillator in the PLL device according to the second embodiment.

Thus, through repetition of the phase comparisons, the output (output signal) FO of the voltage-controlled oscillator 15 approaches a set frequency D (see E in FIG. 6). FIG. 6 shows a rising feature of the output signal FO in the PLL device 32 where the horizontal axis represents a time T and the vertical axis represents the frequency of the output signal FO (expressed in FO as well).

In the course of the phase comparisons, the frequency FO of the output signal overshoots (see F in FIG. 6), then downshoots (see G in FIG. 6), and again goes up.

Through repetition of the phase comparisons, the output of the pulse-width/voltage conversion circuit reaches the threshold in at least one of the detectors 37 to 40 (in FIG. 6, the threshold is reached when the time T is at H).

The microcomputer 16 computes, as a set value, 90% of an upper limit Dm (1.05 times the set frequency, for example) of the frequency bounds of the output signal FO of the voltage-controlled oscillator 15 within which the state is judged as being locked, and gives comparison circuits within the detectors 37 to 40 a signal corresponding to the set value as a threshold Vth.

Here, suppose that the detector 38 outputs the detection signal which indicates that the threshold Vth has been reached to the microcomputer 16. Suppose that, in the other detectors 37, 39, 40, the outputs of the pulse-width/voltage conversion circuits have not reached the threshold Vth yet. At this time, the control unit 30 decides that at least one phase comparator (phase comparator 8 in this embodiment) is in a nearly locked state (a before-lock state in another expression).

As described above, when the threshold Vth is reached and either one of the detectors 37 to 40 generates a detection signal Dth (S6) after an overshoot is detected (S4) and then an undershoot is detected (S5), the control unit 30 decides that at least one comparator is in the nearly locked state (S7).

In order to make decisions at steps S4 or S6, another comparison circuit different from the comparison circuit 37*c* having a different threshold is used. Alternatively, the output of the pulse-width/voltage conversion circuit may be input into the microcomputer to perform these comparison operations by the microcomputer.

When this decision is made (made at the time H in FIG. 6), the control unit 30 causes the phase comparators 7, 8, 9, 10 to switch to output a single phase comparison signal instead of a plurality of (four, for example) phase comparison signals (S8). That is, the control unit 30 allows one phase comparator (phase comparator 10, for example) to keep on delivering its output. In this case, it is desirable to allow the phase comparator (8) that has been judged as being in the nearly-locked state to keep on delivering its output, however, it is not imperative, and therefore explanation will be given assuming that another phase comparator 10 is allowed to keep on delivering its output.

Specifically, the control unit 30 continues to output the control signal G4 which is at the high level to maintain the gate 29 in the on-state. The control unit 30 also outputs the control signals G1, G2, G3 which are at the low level to turn off the gates 26, 27, 28. As a result, the outputs of the other phase comparators 7, 8, 9 are disabled.

Concurrently with the above operations, the control unit 30 causes only the variable frequency divider 14 connected to the phase comparator 10 keeping on delivering its output to continue its frequency division operation. The control unit 30 causes the other variable frequency dividers 11, 12, 13 to stop their frequency division operations. That is, the control unit 30 turns on only the gate 25, and turns off the gates 22, 23, 24.

Switching the number of the phase comparison signals from four to one at the time H in this manner makes a smooth establishment of lock thereafter. Thus, the signal FO is locked at the time J.

Figure 1:
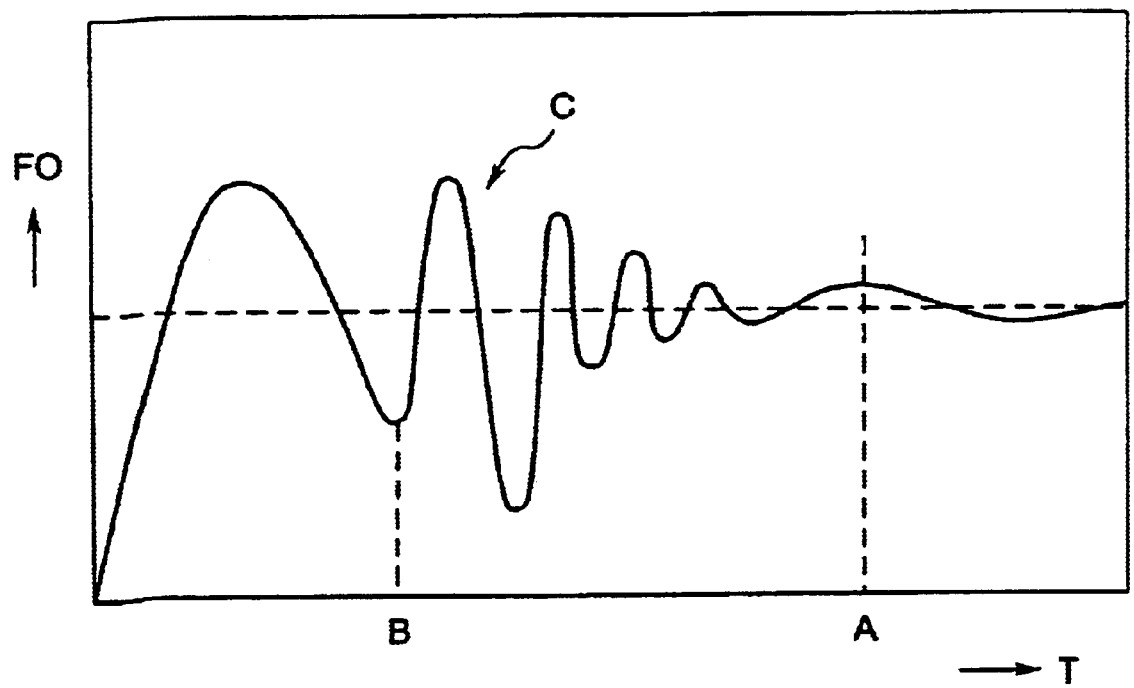
FIG. 1 is a view showing a start-up characteristic of an output signal of a voltage-controlled oscillator in a conventional PLL device.

When the frequency FO of the output signal lies stably within the bounds not exceeding or not falling from the set frequency D by plus or minus 5% for example, it is taken as locked. Setting the switching time H ahead of lock, or performing the switching when lock is approaching avoids the previously occurring lock failure C (FIG. 1).

Through a test conducted by the present inventor, it has been found that it is preferable to switch the number of the phase comparison signals from four to one when the frequency FO of the output signal reaches 70% to 95% (or 73.5% to 99.75% of the set frequency) of the upper limit Dm (1.05 times the set frequency, for example) of the bounds of the frequency FO of the output signal within which the state is judged as being locked after the overshoot period F and the downshoot period G.

Through the test conducted by the inventor, it has been found that if the percentage is smaller than 70%, frequency fluctuation (lock failure) after the switching occurs frequently. It has been also found that if the percentage is larger than 95%, the phenomenon in which the outputs (phase comparison signals) of the phase comparators 7 to 10 interfere with each other occurs frequently.

Furthermore, through the test conducted by the inventor, it has been found that it is possible to suppress, to the extent of causing no practical trouble, the phenomenon in which the outputs of the phase comparators 7 to 10 interfere with each other if the switching is performed when the percentage with respect to the Dm is set between 85% and 95% (between 89.25% and 99.75% of the set frequency D). The above percentage may be a ratio of the frequency FO of the output signal to the set frequency D.

A Third Embodiment

A PLL device according to a third embodiment of the invention has the same circuit configuration as the PLL device 1 according to the first embodiment. However, the control unit 30, especially its microcomputer 16 operates differently.

Figure 7:
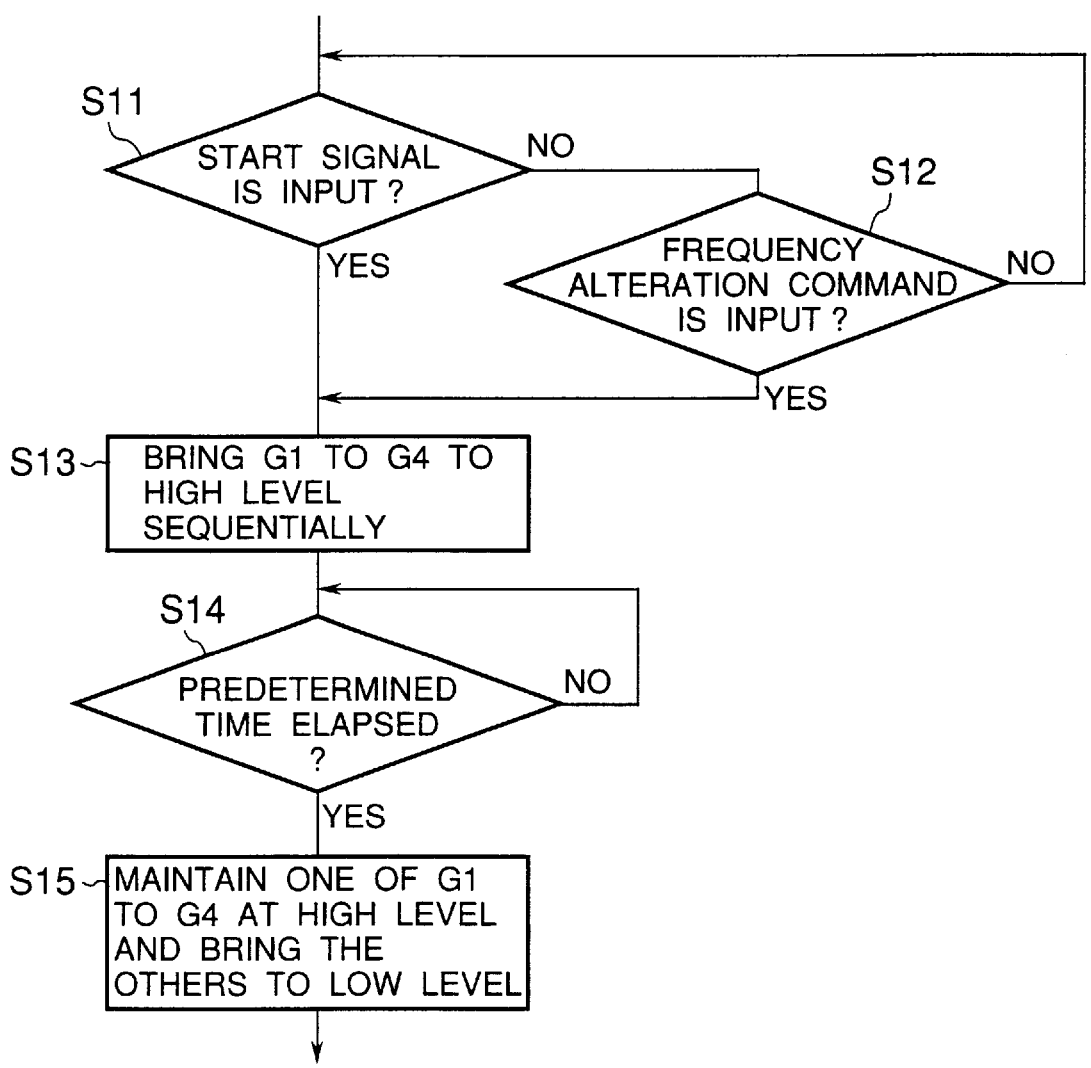
FIG. 7 is a flowchart showing the operation of a PLL device according to a third embodiment of the invention.

The operation of the control unit will be explained with reference to FIG. 7.

In a PLL device 33, when a start signal (a signal output when the user presses the start key) is input (S11), or when a frequency alteration command is input (S12), the control signals G1, G2, G3, G4 are brought to the high level sequentially in steps of TR/4, so the group of the gates 22 and 26, the group of the gates 23 and 27, the group of the gates 24 and 28, and the group of the gates 25 and 29 turn on sequentially (S3).

As a result, all of the variable frequency dividers 11, 12, 13, 14 divide the frequency of the voltage-controlled oscillator 15, and output the feedback signals when the start signal is input or when the frequency alteration signal is input.

The phase comparators 7, 8, 9, 10 compare phases between the feedback signals and the reference signals, and output error signals to the low-pass filter 21. Through repetition of the phase comparisons, the output signal FO approaches the locked state.

After a lapse of a certain period of time (50 microseconds to 1 millisecond, for example) after the start signal or the frequency alteration command is input (S14), the control unit 30 allows one of the phase comparators (phase comparator 9, for example) to keep on delivering its output, and disables the outputs of the other phase comparators 7, 8, 10 (S15).

At this time, the control unit 30 continues to output the control signal G3 which is at the high level to maintain the gate 28 in the on-state. The control unit 30 also brings the control signals G1, G2, G4 to the low level to turn off the gates 26, 27, 29. As a result, the outputs of the other phase comparators 7, 8, 10 are disabled.

Concurrently with the above operations, the control unit 30 causes only the variable frequency divider 13 connected to the phase comparator 9 that keeps on delivering its output to continue the frequency division operation. The control unit 30 causes the other variable frequency dividers 11, 12, 14 to stop their frequency division operations. That is, the control unit 30 maintains only the gate 24 in the on-state, and turns off the gates 22, 23, 25.

In the above described embodiments 1 to 3, the numbers of the variable frequency dividers 11 to 14 and the phase comparators 7 to 10 are four, however, it is not imperative. For example, it is permissible to integrate the four variable frequency dividers 11 to 14 into a single variable frequency divider that serves the functions of the variable frequency dividers 11 to 14 on a time division basis. Furthermore, it is permissible to integrate the phase comparators 7 to 10 into a single phase comparator that serves the functions of the phase comparators 7 to 10 on a time division basis.

A Fourth Embodiment

Figure 8:
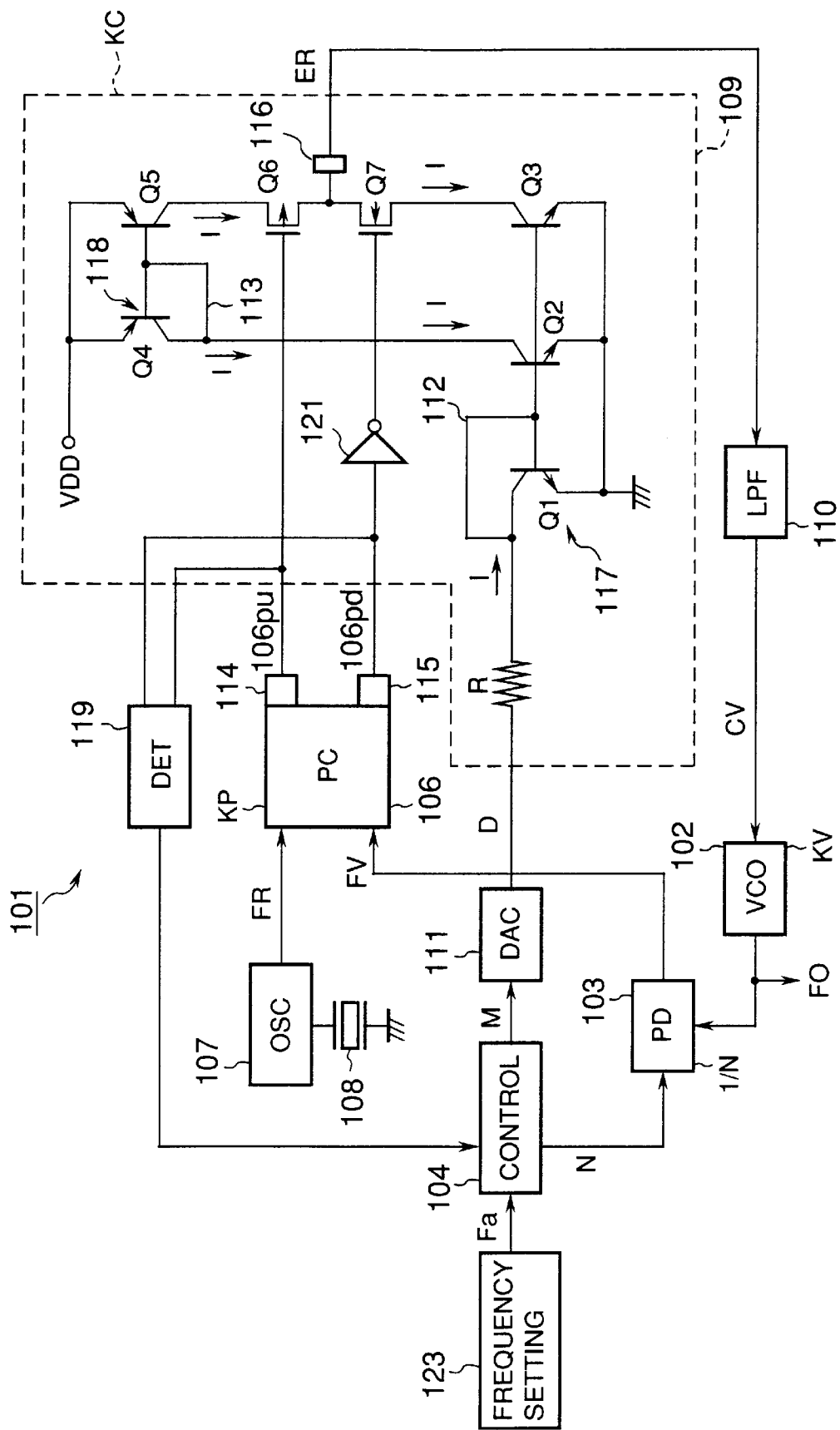
FIG. 8 is a block diagram showing the operation of a PLL device according to a fourth embodiment of the invention.
Figure 9:
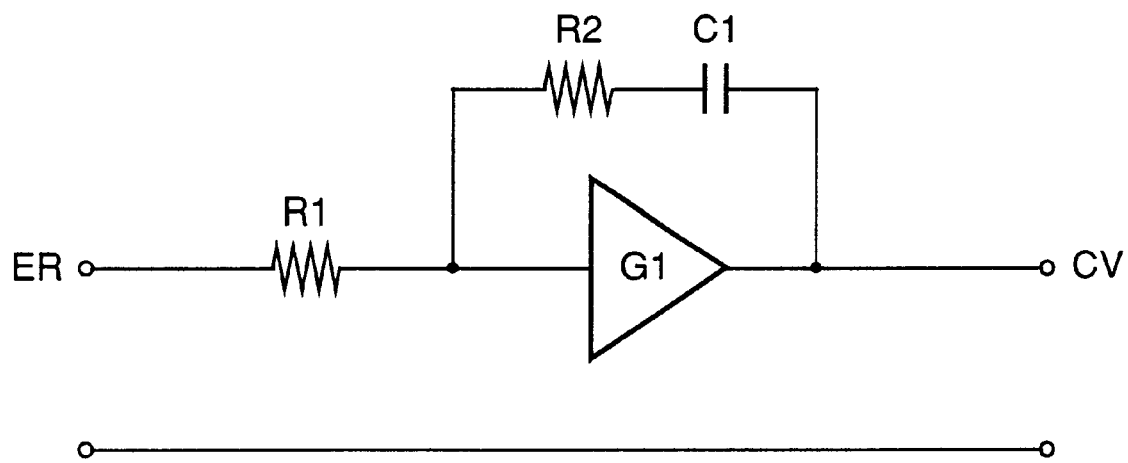
FIG. 9 is a circuit diagram showing details of an LPF of the fourth embodiment.

A PLL device 101 according to a fourth embodiment of the invention will be explained with reference to FIG. 8. In FIG. 8, a voltage-controlled oscillator 102 outputs an output signal FO. The output signal FO is input into a variable frequency divider 103. A control unit 104, which is comprised of a microcomputer for example, outputs a digital signal to the variable frequency divider 103 to designate a frequency-division ratio N. The variable frequency divider 103 divides the frequency of the output signal FO from the voltage-controlled oscillator 102 by the frequency-division ratio N, and outputs the divided signal to a phase comparator 106 as a feedback signal FV.

A reference oscillator 107 has an input connected to a quartz oscillator 108 and on output connected to a phase comparator 106. The reference oscillator 107 generates a reference signal FR of 10 kHz for example, and outputs it to the phase comparator 106.

At least one phase comparator 106 (only one is illustrated) compares phases between the feedback signal FV and the reference signal FR, and outputs, as a result of the comparison, a first output signal (pump-down signal) 106*pd* and a second output signal (pump-up signal) 106*pu* to a charge pump 109. The charge pump 109 outputs an error signal ER to a low-pass filter 110 according to the outputs 106*pd* and 106*pu* of the phase comparator 106. The first output signal 106*pd* and the second output signal 106*pu* are referred to as a phase comparison signal.

The low-pass filter 110, which is comprised of resistors R1 and R2, a capacitor C1 and an operational amplifier G1 for example, amplifies the error signal ER and outputs it to the voltage-controlled oscillator 102 as a control voltage CV in which high frequency components are suppressed. The voltage-controlled oscillator 102 outputs the output signal FO having the frequency FO responsive to the control voltage CV to the variable frequency divider 103.

A DA converter 111 converts a control signal (digital signal) M delivered from the control unit 104 into an analog signal, and supplies an output voltage D which is in proportion to the control voltage M to the charge pump 109.

The charge pump 109 is comprised of an inverter 121, a resistor R3, transistors Q1 to Q7, etc. for example. The transistor Q1 has a collector connected to the output of the DA converter 111 through the resistor R3, an emitter connected to the ground, and a base connected to the base of the transistor Q2. The collector and base of the transistor Q1 are connected with each other through a lead wire 112.

The transistor Q2 has an emitter connected to the ground and a collector connected to a collector of the transistor Q4. The transistor Q3 has a base connected to the base of Q2, an emitter connected to the ground, and a collector connected to a source of the transistor Q7 (which is comprised of an n-channel MOSFET for example, and is referred to as a first switching unit hereinafter). A gate of the first switching unit Q7 is connected to an output terminal of the inverter 121, and an input terminal of the inverter 121 is connected to a first output terminal of the phase comparator 106.

The transistor Q4 has an emitter connected to a supply terminal of a power supply voltage VDD and a base connected to a base of the transistor Q5. The base and collector are connected with each other through a lead wire 113.

A drain of the transistor Q6 (which is comprised of a p-channel MOSFET for example, and is referred to as a second switching unit hereinafter) is connected to a collector of the transistor Q5. A gate of the second switching unit Q6 is connected to a second output terminal 114 of the phase comparator 106. A source of the second switching unit Q6 is connected to a drain of the first switching unit Q7. A node of the source and the drain is connected to the low-pass filter 110 through an output terminal.

The resistor R3, lead wire 112, and transistors Q1, Q2, Q3, etc. form a first mirror circuit 117, so the currents flowing through the collectors of the transistors Q1, Q2, Q3 are maintained at the same value I. This current value I is determined from the voltage D output from the DA converter 111, resistor 3, and transistor Q1. That is, the current value I is a value which correlates with the output voltage D that is proportional to the control signal M. The first switching unit Q7 is connected to the first mirror circuit 117.

Similarly, the lead wire 113 and the transistors Q1, Q2, Q3, etc. form a second mirror circuit 118, so the currents flowing through the collectors of the transistors Q4 and Q5 are of the same value I that is identical with the current value I flowing through the first mirror circuit 117. The second switching unit Q6 is connected to the second mirror circuit 118.

A detector 119 is configured in the same way as the detector 37 (the detail are shown in FIG. 3) of FIG. 2. The above elements form a PLL device 101.

The operation of the PLL device 101 will be explained with reference to FIGS. 8 and 6. The user sets his desired frequency Fa in a frequency setting unit 123 connected to the control unit 104. The control unit 104 computes the frequency-division ratio N (analog value) in which the frequency Fa is divided by 10 (because the frequency of the reference signal FR is 10 kHz). The control unit 104 converts the analog value into data (n-bit digital value) of the frequency-division ratio N by a built-in AD converter.

The control unit 104 outputs the data of the frequency-division ratio N to the variable frequency divider 103, and outputs the value of the control signal M to the DA converter 111 as a first predetermined value M1. The DA converter 111 performs DA conversion on the control signal M having the value of M1, and outputs the output voltage D having the value D1 which is proportional to the value M1 of the control signal M.

The variable frequency divider 103 divides the frequency of the output signal FO output from the voltage-controlled oscillator 102, and outputs the divided signal to the phase comparator 106 as the feedback signal FV. The phase comparator 106 compares phases between the reference signal FR output from the reference oscillator 107 and the feedback signal FV.

The PLL device 101 is in the start-up state (the frequency of the output signal FO has not yet reached the set frequency D) in the above explanation (see E in FIG. 6). At this time, the frequency of the output signal FO is lower than the set frequency D. Accordingly, as a result of the phase comparison, the phase comparator 106 brings the 106*pd* (pump-down signal) output from the first output terminal 115 to the high level. The phase comparator 106 also brings the 106*pu* (pump-up signal) output from the second output terminal 114 to the low level.

Thus, the gate of the first switching unit Q7 connected to the output of the inverter 121 connected to the first output terminal 115 is applied with the output signal at the low level, and accordingly the first switching unit Q7 turns off. The gate of the second switching unit Q6 connected to the second output terminal 114 is applied with the second output signal 106*pu* (low level), and accordingly the second switching unit Q6 turns on.

On the other hand, the current I having the value of I1 flows through the collectors of the transistors Q1 and Q2 that form the first mirror circuit in accordance with the output of the DAC 111, and the current having the same value of I1 flows through the collectors of the transistors Q4 and Q5 that form the second mirror circuit 118.

Since the first switching unit Q7 is off and the second switching unit Q6 is on at this time, the current having the value of I1 flows into the low-pass filter 110 by way of the transistor Q5, the second switching unit Q6, and the output terminal 116.

The above material is summarized as follows. When the phase comparator 106 supplies the second switching unit Q6 with the second output signal 106*pu*, the second switching unit Q6 turns on. The current having the value of I1 flowing through the transistor Q5 of the second mirror circuit 118 is discharged (supplied) to the low-pass filter 110 as the output current (error signal ER) of the charge pump 109.

As described above, the value I1 of the current I correlates with the value D1 of the output voltage D that is proportional to the value M1 of the control signal M, and accordingly as the value of the control signal M increases, the value of current I increases.

Through repetition of such phase comparisons, the frequency of the output signal FO increases step by step. If it exceeds the set frequency D (see F in FIG. 6: it means the overshoot state), the phase comparator 106 brings the 106*pd* signal output from the first output terminal 115 to the low level, and brings the 106*pu* signal output from the second output terminal 114 to the high level.

The gate of the first switching unit Q7 is thus supplied with a signal at the high level, and therefore the first switching unit Q7 turns on. On the other hand, since the gate of the second switching unit Q6 connected to the second output terminal 114 is supplied with the second output signal 106*pu* at the high level, the second switching unit Q6 turns off.

As a result, currents having the value of I1 respectively flow through the collectors of the transistors Q1, Q2, and Q3 that form the first mirror circuit 117, and a current having the same value of I1 flows through the collect or of the transistor Q4 that forms the second mirror circuit 118. Since the first switching unit Q7 is on and the second switching unit Q6 is off at this time, the current having the value of I1 flows into the low-pass filter 110, the output terminal 116, the first switching unit Q7, the transistor Q3, and a grounding member (ground)

The above material is summarized as follows. The phase comparator 106 generates the first output signal 106*pd* at the low level, and the first switching unit Q7 turns on when the output of the inverter 121 rises to the high level. The current having the value of I1 that flows through the transistor Q3 of the first mirror circuit 117 is drawn into the low-pass filter 110 as the output current (error signal ER) of the charge pump 109.

As described above, the output current (error signal ER) of the charge pump 109 is to be varied depending on the outputs correlated with the control signal M1 (the output voltage D that is proportional to the control signal M1, for example) even when FV>FR.

Through repetition of such phase comparisons, the frequency of the output signal FO decreases step by step. If it becomes lower than the set frequency D (see G in FIG. 6: it means the downshoot state), the first output signal 106*pu* of the phase comparator 106 falls to the low level, the second switching unit Q6 turns on, and the first switching unit Q7 turns off. As a result, the current having the value of I1 that flows through the transistor Q5 of the second mirror circuit 118 is supplied to the low-pass filter 110 as the error signal ER from the charge pump 109.

Through repetition of the above operations including the phase comparisons, the voltage signal output from the pulse-width/voltage conversion circuit within the detector 119 reaches the threshold Vth (the time H in FIG. 6).

The control unit 104 computes, as a set value, 90% of the upper limit Dm (or 1.05 times the set frequency) of the frequency bounds of the output signal FO of the voltage-controlled oscillator 102 under lock, and gives a comparison circuit within the detector 119 a signal corresponding to the set value as the threshold Vth.

When the output of the pulse-width/voltage conversion circuit within the detector 119 reaches the threshold Vth, the comparison result signal rises to the high level and is given to the control unit 104 (the time H in FIG. 6).

The control unit 104 decides that the PLL device 101 is in the "nearly locked state" from the comparison result signal received. The control unit 104 sets the value of the control signal M to a predetermined value M2 that is smaller than M1, and outputs it to the DA converter 111.

The DA converter 111 converts the control signal M having the value of M2 (analog value) to an analog value, and gives the charge pump 109 an output voltage having the value of D2 that is proportional to the control signal M2. As a result, the currents flowing through the first mirror circuit 117 and the second mirror circuit 118 are switched to I2 that is smaller than the previous value of I1. Thus, the current I2 flowing through the second mirror circuit 118 is supplied to the low-pass filter 110 as the error signal ER from the charge pump 109 at the time H (see FIG. 6).

The above material is summarized as follows. The value of the error current I is kept at I1 before the time H, but when the "nearly locked state" is detected by the comparison circuit within the detector 119, then the control unit 104 causes the charge pump 109 to switch the current of the error signal ER from I1 to I2 at the time H.

When the frequency of the output signal FO exceeds the set value D (see K in FIG. 6) through repetition of the operations including the phase comparisons, the first output signal 106*pd* of the phase comparator 106 falls to the low level again, so the output of the inverter 121 rises to the high level and accordingly the first switching unit Q7 turns on. On the other hand, the second output signal 106*pu* rises to the high level and accordingly the second switching Q6 turns off. As a result, the current I having the value of I2 that flows through the first mirror circuit 117 is drawn into the low-pass filter 110 as the error signal ER from the charge pump 109.

As described above, by switching (reducing) the current of the error signal ER from I1 to I2 at the "nearly locked" point (at the time H, for example), previously occurring lock failure C can be avoided (see FIG. 1). As a result, lock is established smoothly thereafter. That is, the output signal FO is locked at the time J. That is, the output signal lies within the bounds not exceeding or not falling from the set frequency D by plus or minus 5%, and settles.

(Normally, when the frequency FO of the output signal lies stably within the bounds not exceeding or not falling from the set frequency D by plus or minus 5% for example, it is taken as locked).

Through a test conducted by the inventor, it has been found that it is preferable to switch the error signal ER from I1 to I2 when the frequency FO of the output signal reaches 70% to 95% of the upper limit Dm (1.05 times the set frequency, for example) of the bounds of the frequency FO of the output signal of the voltage-controlled oscillator 102 within which the state is judged as being locked after the overshoot period F and the undershoot period G.

As an example, I1=11 mA, and I2=1.4 mA.

Through the test conducted by the inventor, it has been found that if the percentage is smaller than 70%, the phenomenon of frequency fluctuation (lock failure expressed by C in FIG. 6) after switching occurs frequently. If the percentage is larger than 95%, there arises a problem of frequent noises and increased power consumption.

Through the test conducted by the inventor, it has been found that it is possible to suppress, to the extent of causing no practical trouble, the phenomenon of lock failure and the phenomenon in which the outputs of the phase comparators interfere with each other if the switching is performed when the ratio is between 85% and 95%. The above percentage may be a ratio of the frequency FO of the output signal to the set frequency D.

A Fifth Embodiment

Figure 10:
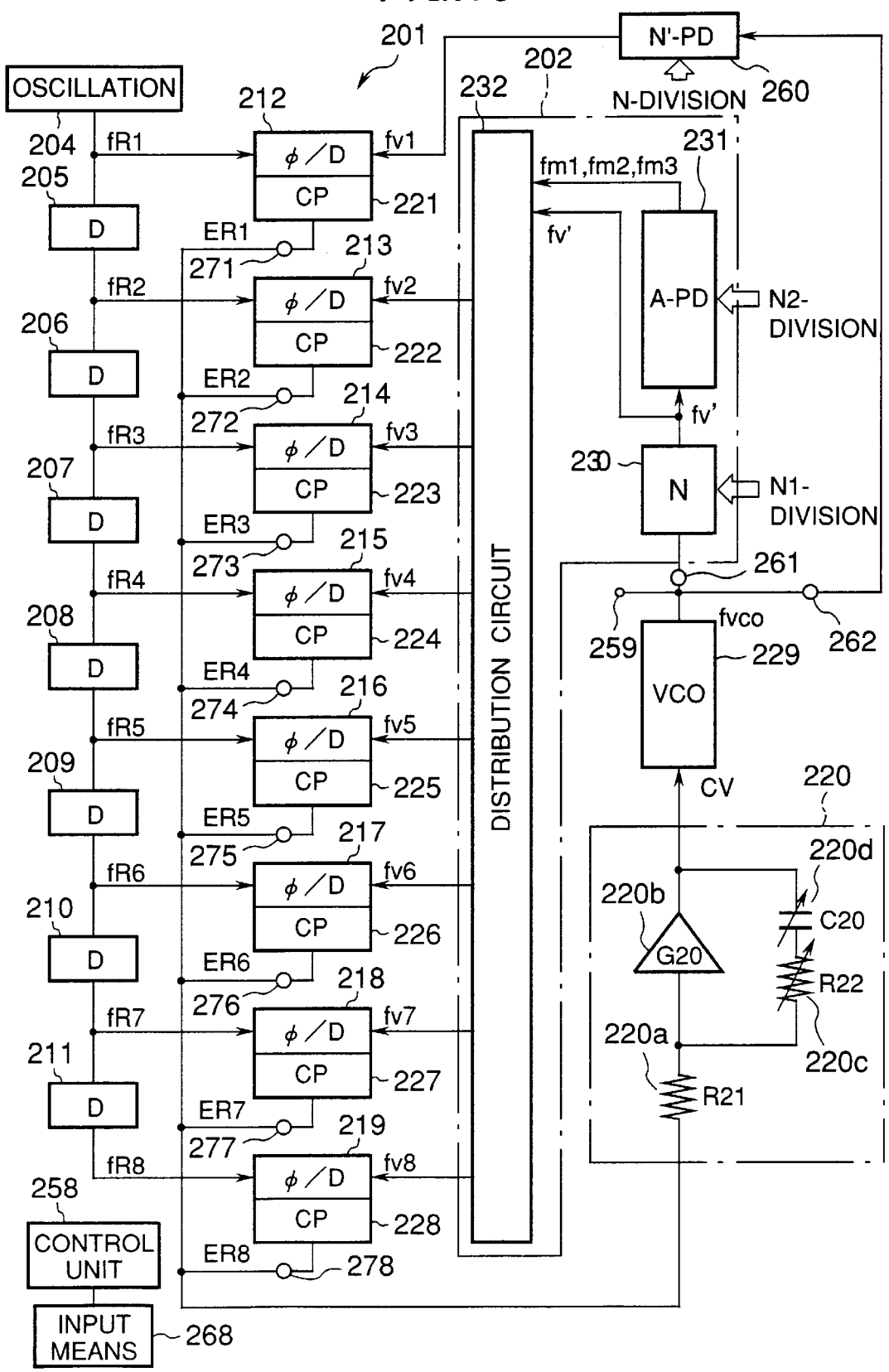
FIG. 10 is a block diagram showing a PLL device according to a fifth embodiment of the invention.
Figure 11:
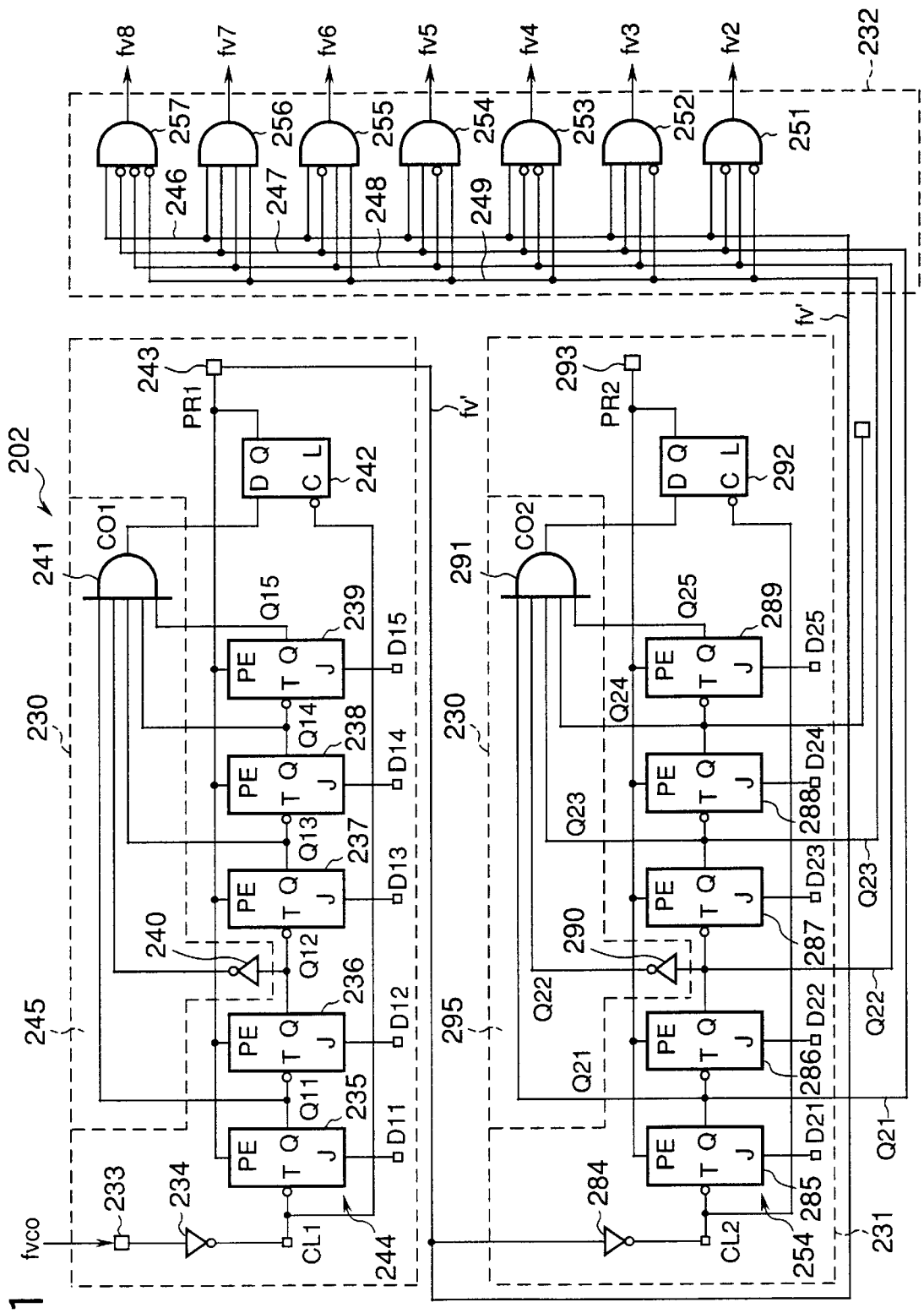
FIG. 11 is a block diagram showing details of a frequency-dividing unit of the fifth embodiment.
Figure 13:
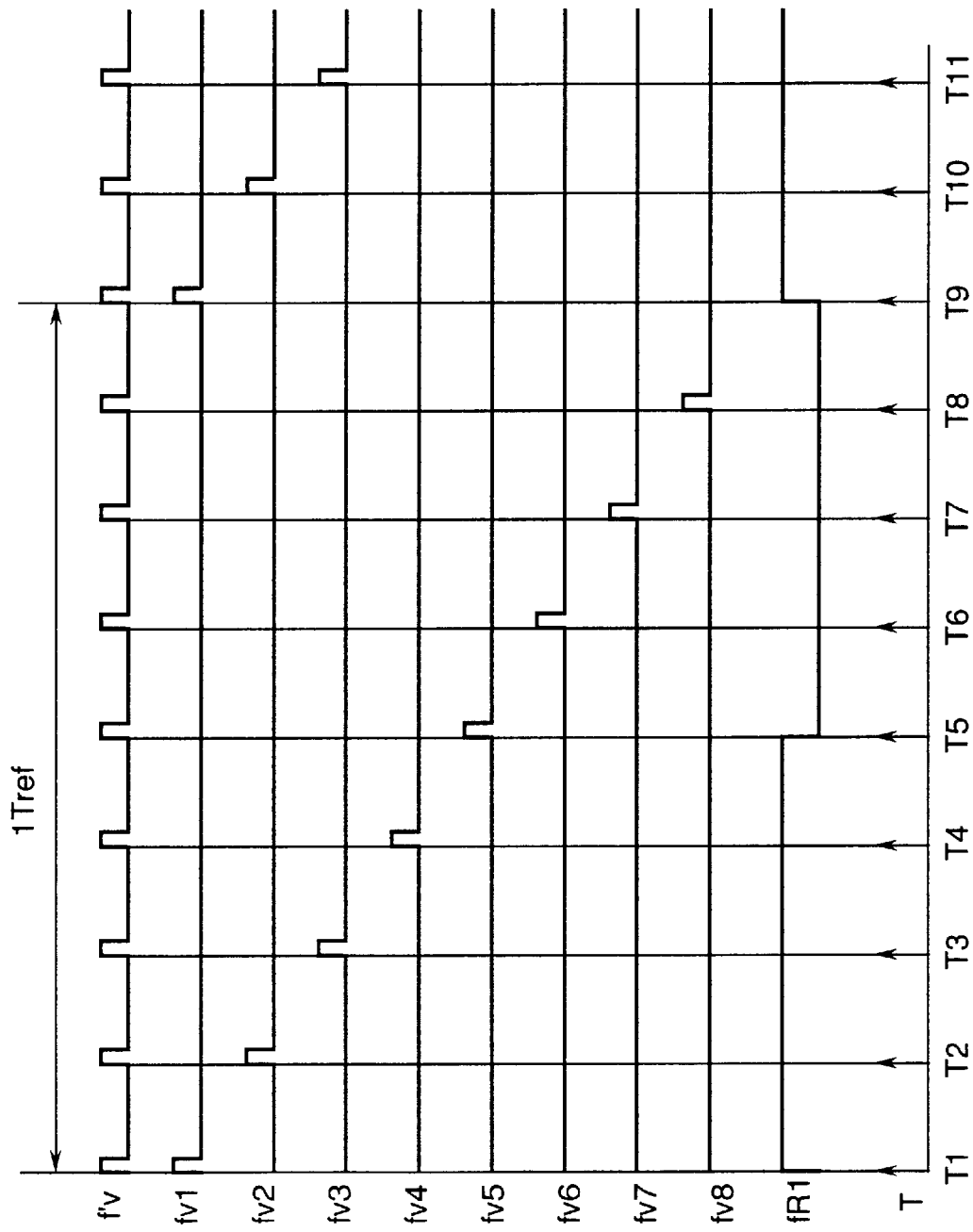
FIG. 13 is a timing diagram of feedback signals fV1 to fV8 etc. that appear in the PLL device according to the fifth embodiment.

A PLL device 201 according to a fifth embodiment will be explained with reference to FIGS. 10 and 11. FIG. 10 is a block diagram of the PLL device 201, and FIG. 11 is a detailed block diagram of a frequency dividing unit 202 used in the PLL device 201. In these Figs., a reference signal generating means 203 is comprised of a reference oscillator 204, seven delay by; circuits 205 to 211 connected in series, etc., for example. The reference oscillator 204 outputs a reference signal fR1 of 10 kHz for example. A timing diagram of FIG. 13 shows a waveform of the reference signal fR1. The reference signal fR1, which is generated at predetermined intervals (eight times that of the timings T1, T2 . . . ), rises at the timings T1 and T9. The reference signal fR1 is input into one input terminal of a phase comparator 212.

The delay circuit 205 receives the reference signal fR1, and delays the reference signal fR1 by 1/8 of its period (1 Tref), and supplies it to a phase comparator 213 as a reference signal fR2. The delay circuit 206 delays the output of the delay circuit 205 by 1/8 of the period of the reference signal fR1 to supply a signal that lags behind the reference signal fR1 by 2/8 period to a phase comparator 214 as a reference signal fR3. The delay circuit 207 delays the output of the delay circuit 206 by 1/8 of the period of the reference signal fR1 to supply a signal that lags behind the reference signal fR1 by 3/8 period to a phase comparator 215 as a reference signal fR4. The delay circuit 208 delays the output of the delay circuit 207 by 1/8 of the period of the reference signal fR1 to supply a signal that lags behind the reference signal fR1 by 4/8 period to a phase comparator 216 as a reference signal fR5.

The delay circuit 209 delays the output of the delay circuit 208 by 1/8 of the period of the reference signal fR1 to supply a signal that lags behind the reference signal fR1 by 5/8 period to a phase comparator 217 as a reference signal fR6. The delay circuit 210 delays the output of the delay circuit 209 by 1/8 of the period of the reference signal fR1 to supply a signal that lags behind the reference signal fR1 by 6/8 period to a phase comparator 218 as a reference signal fR7. The delay circuit 211 delays the output of the delay circuit 210 by 1/8 of the period of the reference signal fR1 to supply a signal that lags behind the reference signal fR1 by 7/8 period to a phase comparator 219 as a reference signal fR8.

In this manner, the reference signal generating means 203 generates a plurality of the reference signals fR1 to fR8 having mutually differing phases.

The rising points of the reference signals fR1 to fR8 are expressed as the timings T1 to T8 (see FIG. 13).

To the other inputs of the phase comparators 212 to 219 supplied are feedback signals fV1 to fV8 (described after).

The phase comparator 212 compares the phase of the feedback signal fV1 with the phase of the reference signal fR1, and outputs a pump-up signal and a pump-down signal to a charge pump 221 as a result of the comparison. The charge pump 221 outputs an error signal ER1 to a low-pass filter 220 on the basis of both of the above signals.

Likewise, the phase comparators 213 to 219 compare the phases of the feedback signals fV2 to fV8 with the phases of the reference signals fR2 to fR8. The phase comparators 213 to 219 respectively output a pump-up signal and a pump-down signal to charge pumps 222 to 228 as results of the comparisons.

The charge pumps 222 to 228 respectively output error signals ER2 to ER8 to the low-pass filter 220 on the basis of both of the above signals.

That is, the phase comparators 212 to 219 compare phases between the feedback signals and the reference signals, and output the error signals ER1 to ER8 through the charge pumps 221 to 228.

The low-pass filter 220 is comprised of a resistor 220a, an amplifier 220b, a variable resistor 220c, and a variable capacitor 220d, for example. The resistor 220a is connected to the input of the amplifier 220b, and the output of the amplifier 220b is connected to the input of a voltage-controlled oscillator 229. The variable resistor 220c and the variable capacitor 220d are connected in series, and one end of the series connection is connected to the input of the amplifier 220b, and the other end of the series connection is connected to the output of the amplifier 220b.

A resistance R22 of the variable resistor 220c is set to a predetermined value by a control signal output from a control unit 258. A capacitance of the variable capacitor 220d is set to a predetermined value by the control signal output from the control unit 258. A gain of the amplifier 220b is set to a predetermined value by the control signal output from the control unit 258.

The low-pass filter 220 outputs a control voltage CV to the voltage-controlled oscillator 229 in response to the error signals ER1 to ER8. The voltage-controlled oscillator 229 outputs an output signal fVCO in response to the control voltage CV.

The frequency dividing unit 202 includes a main frequency divider 230, a secondary frequency divider 231, and a distribution circuit 232. The main frequency divider 230 divides the frequency of the output signal fVCO of the voltage-controlled oscillator 229 by a frequency-division ratio N1, and outputs an intermediate signal fV'. The secondary frequency divider 231 divides the frequency of the intermediate signal fV' output from the main frequency divider 230 by a frequency-division ratio N2, and outputs signals fm1, fm2, fm3.

A frequency dividing unit 260, which is comprised of a 13-bit variable frequency divider for example, has an input connected to the output of the voltage-controlled oscillator 229 (input of the main frequency divider 230), and an output connected to the other input terminal of the phase comparator 212. The control unit 258 sets a set frequency-division ratio N (N being an integer) in the second frequency dividing unit 260.

A gate 261 is disposed between the voltage-controlled oscillator 229 and the main frequency divider 230, and a gate 262 is disposed between the voltage-controlled oscillator 229 and the frequency dividing unit 260. Furthermore, gates 271 to 278 are disposed between the charge pumps 221 to 228 and the low-pass filter 220.

With this configuration, the frequency dividing unit 260 divides the frequency of the output signal fVCO of the voltage-controlled oscillator 229 by the set frequency division ratio N, and supplies the feedback signal fV1 that is an output thereof to the phase comparator 212. As described above, the frequency dividing unit 260 outputs the feedback signal fV1 to at least one phase comparator (phase comparator 212 in this embodiment).

It is permissible to configure the frequency dividing unit 260 to output the feedback signal to or more phase comparators as necessary.

The distribution circuit 232 converts the intermediate signal fV' and the signals fm1, fm2, fm3 output from the secondary frequency divider 231 into a plurality of the feedback signals fV2 to fV8, and outputs them to the phase comparators 213 to 219.

The main frequency divider 230 is comprised of, for example, an input terminal 233, an inverter 234, toggle flip-flops 235 to 239, an inverter 240, an AND gate 241, a D-flip-flop 242, and an output terminal 243. The inverter 234 is connected between the input terminal 233 and the toggle flip-flop 235. The toggle flip-flops 235 to 239 each including input-inverting function are connected in series. J-terminals of the toggle flip-flops 235 to 239 are connected to control input terminals D11 to D15.

The control input terminals D11 to D15 are applied with bits of a 5-bit control signal designating a frequency-division ratio.

The toggle flip-flops 235 to 239 form a counter 244. The counter 244, which takes in an inverted version of the output signal fVCO of the voltage-controlled oscillator 229 as a clock pulse CL1, is preset at the frequency-division ratio N by a signal PR1 applied to terminals PE, and down-counts the clock pulse CL1. A coincidence circuit 245 includes the inverter 240 and the AND gate 241.

Output terminals Q of the toggle flip-flops 235, and 237 to 239 are connected to input terminals of the AND gate 241. An output terminal Q of the toggle flip-flop 236 is connected to one of the input terminals of the AND gate 241 through the inverter 240. With this configuration, the coincidence circuit 245 outputs a detection signal CO1 which rises to the high level when the output of the counter 244 becomes "2".

The D-flip-flop 242, which has input inverting function and takes in an inverted version of the output signal fVCO as a clock pulse, outputs, through a terminal Q, the signal PR1 developed by delaying the detection signal CO1 from the coincidence circuit 245 by one period of the output signal fVCO. That is, the signal PR1 is output from the output terminal 243 as the intermediate signal fV'.

Thus, when predetermined inputs are applied to the input terminals D11 to D15, the frequency-division ratio N1 is defined, and the intermediate signal fV' developed by dividing the output signal fVCO by the frequency-division ratio N1 is output from the output terminal 243.

The main frequency divider 230 is comprised of a 10-bit variable frequency divider, a counter, or the like.

The secondary frequency divider 231 is comprised of an inverter 284, toggle flip-flops 285 to 289, an inverter 290, an AND gate 291, a D-flip-flop 292, and an output terminal 293, for example. The inverter 284 is connected between the output terminal 243 of the main frequency divider 230 and the toggle flip-flop 285. The toggle flip-flops 285 to 289 each including input-inverting function are connected in series. J-terminals of the toggle flip-flops 285 to 289 are connected to control input terminals D21 to D25.

The control input terminals D21 to D25 are applied with the bits of the 5-bit control signal designating a frequency-division ratio.

The toggle flip-flops 285 to 289 form a counter 294. The counter 294, which takes in an inverted version of the intermediate signal fV' as a clock pulse CL2, is preset at the frequency-division ratio N2 by a signal PR2 applied to terminals PE, and down-counts the clock pulse CL2. A coincidence circuit 295 includes the inverter 290 and the AND gate 291.

Output terminals Q of the toggle flip-flops 285, and 287 to 289 are connected to input terminals of the AND gate 291. An output terminal Q of the toggle flip-flop 286 is connected to one of the input terminals of the AND gate 291 through the inverter 290. With this configuration, the coincidence circuit 295 outputs a detection signal CO2 which rises to the high level when the output of the counter 294 becomes "2".

The D-flip-flop 292, which includes input inverting function and takes in an inverted version of the intermediate signal fV' as a clock pulse, outputs the signal PR2 developed by delaying the detection signal CO2 from the coincidence circuit 295 by one period of the intermediate signal fV'.

Thus, when predetermined inputs are applied to the input terminals D21 to D25, the frequency-division ratio N2 is defined. If N2 is set to 8 for example, the signal fm1 developed by dividing the intermediate signal fV' by 2 is output from the output terminal Q of the toggle flip-flop 285.

Accordingly, the signal fm2 developed by dividing the intermediate signal fV' by 4 is output from the output terminal Q of the toggle flip-flop 286. The signal fm3 developed by dividing the intermediate signal fV' by 8 is output from the output terminal Q of the toggle flip-flop 287. The secondary frequency divider 231 is comprised of a 3-bit variable frequency divider, a counter, or the like.

The distribution circuit 232, which is a decoder for example, includes conductors 246 to 249 and AND gates 251 to 257. The conductors 246 to 249 are connected to the intermediate signal fV' and the signals fm1 to fm3. The conductors 246 to 249 are also connected to a first to fourth input terminals of each of the AND gates 251 to 257. From the above elements formed is the PLL device 201.

Figure 12:
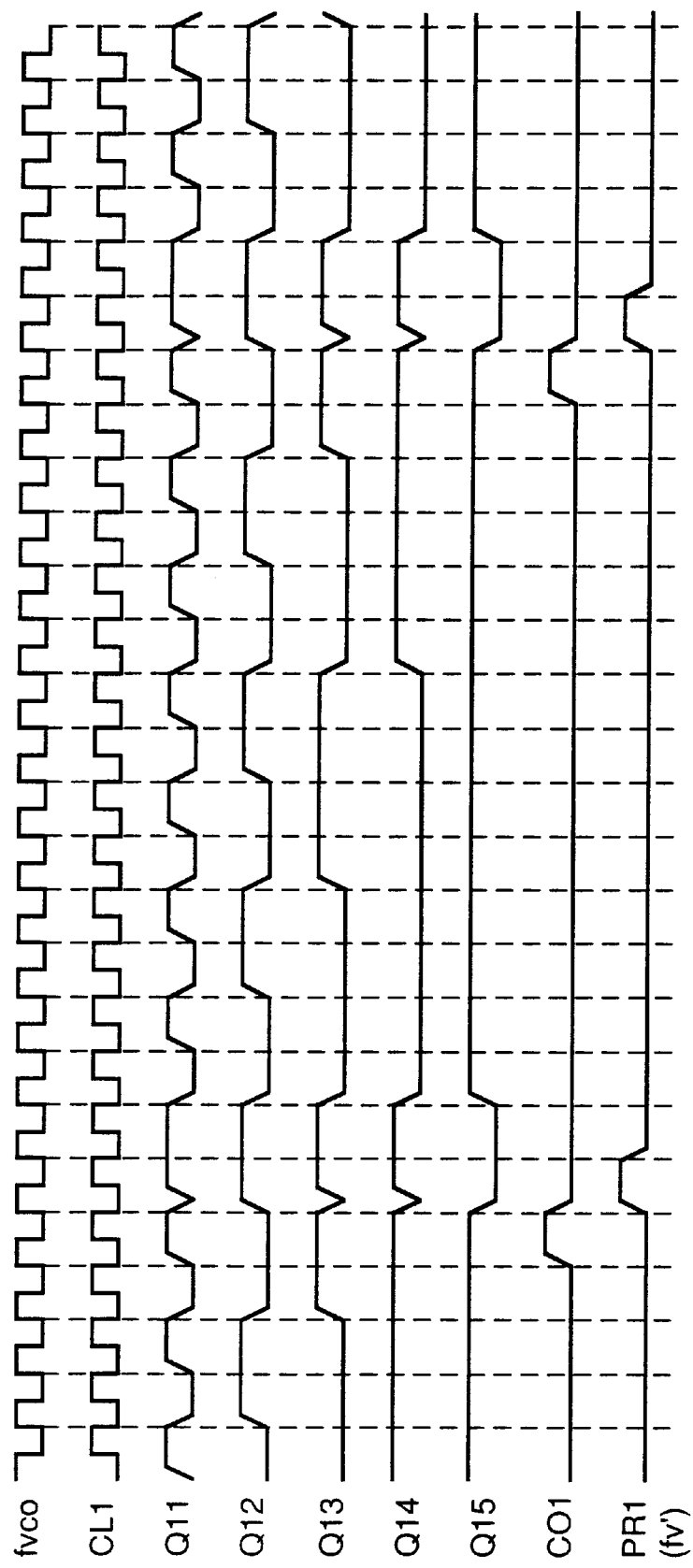
FIG. 12 is a timing diagram showing Q11 to Q15 that appear in the frequency-dividing unit of FIG. 11.

The operation of this PLL device 201 will be explained with reference to FIGS. 10 to 13. FIG. 12 is a timing diagram of the signals fVCO, CL1, Q11 to Q15, CO, and PR1 used in the PLL device 201, and FIG. 13 is a timing diagram of the signals fV and fV1 to fV8. Suppose that the set frequency 1280 kHz of the output signal fVCO is input into the control unit 258 from an input means 268. If the frequency of the reference signal is 10 kHz, the control unit 258 computes N=1280 kHz/10 kHz=128 as the set frequency-division ratio N of the second frequency dividing unit 260.

Then, the control unit 258 sets the frequency division-ratio N1 of the main frequency divider 230 at 16, and sets the frequency-division ratio N2 of the secondary frequency divider 231 at 8 for the set frequency-division ratio N=128. In this way, the control unit 258 operates to make the product of the frequency-division ratio N1 and the frequency-division ratio N2 equal to the set frequency-division ratio N of the frequency dividing unit 260. Furthermore, the control unit 258 turns on all of the gates 261, 262 and 271 to 278 to cause all of the phase comparators 212 to 219 to deliver their outputs and to cause all of the frequency dividing units 202 and 260 to perform the frequency division operations.

That is, in accordance with the above setting of frequency-division ratio N1=16, the input terminals D11 to D15 are applied with signals of "high level", "high level", "high level", "high level", and "low level" respectively. As described above, the main frequency divider 230 divides the output signal fVCO by the variable (programmable) frequency-division ratio N1 when predetermined inputs (high level or low level) are applied to the input terminals D11 to D15.

Since the clock pulse CL1 is an inversion of the output signal fVCO, it has such a waveform as shown by CL1 in FIG. 12. As shown in FIG. 12, the signal Q11 has a waveform in which the frequency of the signal fVCO is divided by two. The signal Q12 has a waveform in which the frequency of the signal Q11 is divided by two. The signal Q13 has a waveform in which the frequency of the signal Q12 is divided by two. The signal Q14 has a wave form in which the frequency of the signal Q13 is divided by two. The signal Q15 has a waveform in which the frequency of the signal Q14 is divided by two.

The AND gate 241 takes a logical AND of the signals Q11, Q12-inverted, Q13, Q14 and Q15, and outputs the signal CO1 (FIG. 12). The signal CO1 is delayed by one period of the output signal fVCO, and then delivered as the signal PR1 (fV').

Applying the signal PR1 to the terminals PE of the toggle flip-flops 235 to 239 causes the signals Q11 to Q15 to have such waveforms as the frequency-division ratio N1 is preset.

In this way, the main frequency divider 230 outputs the intermediate signal fV' developed by dividing the output signal by the frequency-division ratio N1 (N1=16).

The intermediate signal fV' is input into the toggle flip-flop 285 through the inverter 284 of the secondary frequency divider 231. In accordance with the frequency-division ratio N2=8, the input terminals D21 to D25 of the secondary frequency divider 231 are applied with signals of "high level", "high level", "high level", "low level", and "low level" respectively. The secondary frequency divider 231 divides the frequency of the intermediate signal fV' by the variable (programmable) frequency-division ratio N2 when predetermined inputs (high level or low level) are applied to the input terminals D21 to D25 as described above.

As in FIG. 12, the signal Q21 has a waveform in which the frequency of the intermediate signal fV' is divided by two. The signal Q22 has a waveform in which the frequency of the signal Q21 is divided by two. The signal Q23 has a waveform in which the frequency of signal Q22 is divided by two. The signal Q24 has a waveform in which the frequency of the signal is Q23 divided by two. The signal Q25 has a waveform in which the frequency of the signal Q24 is divided by two.

The AND gate 291 takes a logical AND of the signals Q21, Q22-inverted, Q13, Q24 and Q25, and outputs the signal CO2. The D-flip-flop 292 outputs the signal PR2 in response to the signal CO2 received. Applying the signal PR2 to the terminals PE of the toggle flip-flops 285 to 289 causes the signals Q21 to Q25 to have such waveforms as the frequency-division ratio N2 is preset.

With this configuration, the secondary frequency divider 231 outputs the signal Q21 developed by dividing the intermediate signal fV' by two, the signal Q22 developed by dividing the intermediate signal fV' by four, and the signal Q23 developed by dividing the intermediate signal fV' by eight (N2=8) to the distribution circuit 232.

In the distribution circuit 232, the intermediate signal fV' and the signals Q21 to Q23 are input into the input terminals of the AND gates 251 to 257 through the conductors 246 to 249. The control unit 258 controls the second frequency dividing unit 260 such that the feedback signal fV1 output from the frequency dividing unit 260 is synchronized with (with no phase difference) the intermediate signal f V' and has a waveform in which the frequency of the intermediate signal fV' is divided by eight.

The AND gate 251 outputs the feedback signal fV2 representing a logical AND of the signals fV, Q21-iinverted, Q22 and Q23-inverted. As a result, the feedback signal fV2 lags behind the feedback signal fV1 by one period of the intermediate signal fV', and has a waveform in which the frequency of the intermediate signal fV' is divided by eight. Similarly, the feedback signals fV3 to fV8 lag behind the feedback signal fV1 by two, three, four, five, six, and seven periods of the intermediate signal fV' respectively, and have a waveform in which the frequency of the intermediate signal fV' is divided by eight.

In this way, the control unit 258 causes the frequency dividing unit 260 to output the feedback signal fV1 in synchronization with the timing of generation of the reference signal fR1, and the phase comparator 212 compares phases between the feedback signal fV1 and the reference signal fR1. The distribution circuit 232 outputs the feedback signals fV2 to fV8 in synchronization with the timings of generation of the reference signals fR2 to fR8, and the phase comparators 222 to 228 compare phases between the feedback signal fV2 to fV8 and the reference signals fR2 to fR8.

With this configuration, eight phase comparisons are performed during one period (Tref) of the reference signal fR1, so the lock-up time (the time until synchronization with the output signal fVCO is reached) is shortened to approximately ⅛ that in the conventional type with one phase comparator stage. In accordance with the comparisons, the phase comparators 212 to 219 output the pump-up signals and pump-down signals to the charge pumps 221 to 228. The charge pumps 221 to 228 output the error signals ER1 to ER8 to the low-pass filter 220 in accordance with both of the above signals (the gates 261, 262 and 271 to 278 are in the on-state at this time).

The low-pass filter 220 outputs the control voltage CV to the voltage-controlled oscillator 229 in response to the error signals ER1 to ER8. The voltage-controlled oscillator 229 delivers the output signal fVCO in response to the control voltage CV. Through repetition of the operations in the loop, the PLL device 201 begins to deliver the output signal fVCO having the set frequency of 1280 kHz through an output terminal 259 connected to the output of the voltage-controlled oscillator 229.

The above described matters until locked (from the start of the frequency division till locked) are summarized below. First, suppose that the set frequency of the output signal fVCO of 1280 kHz for example is input into the control unit 258. Also suppose that the frequency of the reference signal is 10 kHz. The control unit 258 outputs the set frequency-division ratio N=128 to the frequency dividing unit 260. The control unit 258 outputs the set frequency-division ratio N1=16 to the main frequency divider 230, and also outputs the set frequency-division ratio N2=8 to the secondary frequency divider 231.

Next, the control unit 258 sets the low-pass filter 220 in the first state. That is, the control unit 258 outputs the control signal to the low-pass filter 220, sets the gain of the amplifier 220b at a first set value G20a, sets the resistance of the variable resistor 220c at a first set value R22a, and sets the capacitance of the variable capacitor 220d at a first set value C20a. The control unit 258 turns on all of the gates 261, 262 and 271 to 278 to cause all of the phase comparators 212 to 19 to operate, and to cause all of the frequency dividing units 202 and 260 to perform the frequency division operations.

Thus, all the phase comparators 212 to 219 compare phases between the feedback signals fV1 to fV8 output from all of the frequency dividing units 202 and 260 and all of the reference signals fR1 to fR8 until locked. All of the phase comparators 212 to 219 output the error signals ER1 to ER8 to the low-pass filter 220 through the charge pumps 221 to 228 and the gates 271 to 278. In this state before lock, the eight reference signals fR1 to fR8 are subjected to phase comparisons during one period of the reference signal fR, and accordingly, the error signals ER1 to ER8 of approximately 80 kHz are input into the low-pass filter 220. The control unit 258 sets up optimum principal parameters (angular frequency Aa, damping factor Ba, cut-off frequency FCa, etc.) in accordance with these error signals ER1 to ER8 of 80 kHz.

To be more specific, by setting the resistance and the capacitance of the variable resistor 220c and the variable capacitor 220d that form the low-pass filter 220 at their optimum values (the firs set values R22a and C20a), an optimum time constant TCa of the low-pass filter 220 is defined. The optimum angular frequency Aa and optimum damping factor Ba are obtained from this time constant TCa. The optimum cut-off frequency FCa in the proximity of the frequency 80 kHz of the error signals ER1 to ER8 that are input into the low-pass filter 220 is also obtained from this time constant. Furthermore, an optimum gain Gfa of the low-pass filter 220 is obtained from the time constant TCa and the gain (the first set value G20a) of the amplifier 220b.

The phase comparators 212 to 219 are each provided with a detector (it is not shown in FIG. 10, but similar to the detector 37 in FIG. 2). The detector includes an AND gate to which the pump-up signals and pump-down signals output from the phase comparators 212 to 219 are input, a pulse-width/voltage conversion circuit for converting an output of the AND gate into a voltage signal, and a comparison circuit for comparing the voltage signal with a predetermined threshold and outputting a comparison result as a detection signal. The outputs of the detectors are connected to the control unit 258, so if lock is detected, it is reported to the control unit 258.

Suppose that any one of the detectors has detected lock after repetition of the phase comparisons and a lock detection signal has been sent to the control unit 258. The control unit 258 decides that the state is locked, and performs after-lock operations. The control unit 258 turns off the gates 261 and 272 to 278, while keeping the gates 262 and 271 in the on-state.

At the same time, the control unit 258 switches (sets) the low-pass filter 220 to the second state. To be more specific, the control unit 258 outputs the control signal to the low-pass filter 220, and switches (sets) the gain of the amplifier 220b to a second set value G20b, the resistance of the variable resistor 220c to a second set value R22b, and the capacitance of the variable capacitor 220d to a second set value C20b. Since the gates 272 to 278 are in the off-state at this time, the outputs of the phase comparators 213 to 219 are disabled, and since the gate 261 is in the on-state, the frequency dividing unit 202 stops the frequency division operation. On the other hand, since the gates 271 and 262 are in the on-state, the phase comparator 212 keeps on performing the phase comparisons to output the error signal ER1 to the low-pass filter 220 through the charge pump 221. The frequency dividing unit 260 connected to the phase comparator 212 which is delivering its output keeps on performing the frequency division operation.

After lock, since only the reference signal fR1 is subjected to the phase comparison, only the error signal ER1 of 10 kHz is input into the low-pass filter 220. Accordingly, the control unit 258 sets up the optimum principal parameters depending on the error signal ER1 of 10 kHz. Thus, the optimum time constant Tcb is obtained by switching the variable resistor 220c and variable capacitor 220d that form the low-pass filter 220 to have their optimum values (the second set values R22b and C20b) depending on the error signal ER1 of 10 kHz. An optimum angular frequency Ab and optimum damping factor Bb are obtained from this time constant TCb. When the number of the phase comparators which are delivering their outputs are changed (from eight to one in this embodiment), the time constant of the low-pass filter 220 is changed (from TCa to TCb).

A cut-off frequency FCb in the proximity of the frequency 10 kHz of the error signal ER1 which is input into the low-pass filter 220 is obtained from this changed constant TCb. That is, when the time constant is changed (from TCa to TCb), the cut-off frequency of the low-pass filter 220 is changed from FCa (close to 80 kHz) to FCb (close to 10 kHz). In this way, when the number of the reference signals subjected to the phase comparisons is changed to one from eight, the cut-off frequency is changed from FCa to FCb.

Furthermore, an optimum gain Gfb of the low-pass filter 220 is obtained from the time constant TCb and the gain (the second set value G20b) of the amplifier 220b. Let the gain owing to the phase comparators 212 to 219 be KP8 in the before-lock state, the gain of the low-pass filter 220 in the before-lock state be KL8, the gain owing to the phase comparator 212 in the after-lock state be KP1, and the gain of the low-pass filter 22 in the after-lock state be KL1. In order to equalize an overall gain of the PLL loop in the before-lock state with that in the after-lock state, the following equation must hold.

$$KLOOP = KP8 \times KL8 = KP1 \times KL1 \qquad (\text{Ex. 1})$$

The number of the phase comparators 212 to 219 that deliver their outputs is eight in the before-lock state, while the number of the phase comparator 212 that delivers its outputs after lock is one, the following equation holds.

$$KP8 = 8 \times KP1$$

Substituting this equation into Ex. 1 gives the following equation.

$$E2 = 8 \times E1$$

That is to say, the overall gain of the PLL loop can be maintained at the optimum value by setting the gain Gfb of the low-pass filter 220 after lock to eight times the gain Gfa of the low-pass filter 220 in the before-lock state. As described above, when the time constant is changed (from TCa to TCb), the gain of the low-pass filter 220 is changed from Gfa to Gfb.

A Sixth Embodiment

Figure 14:
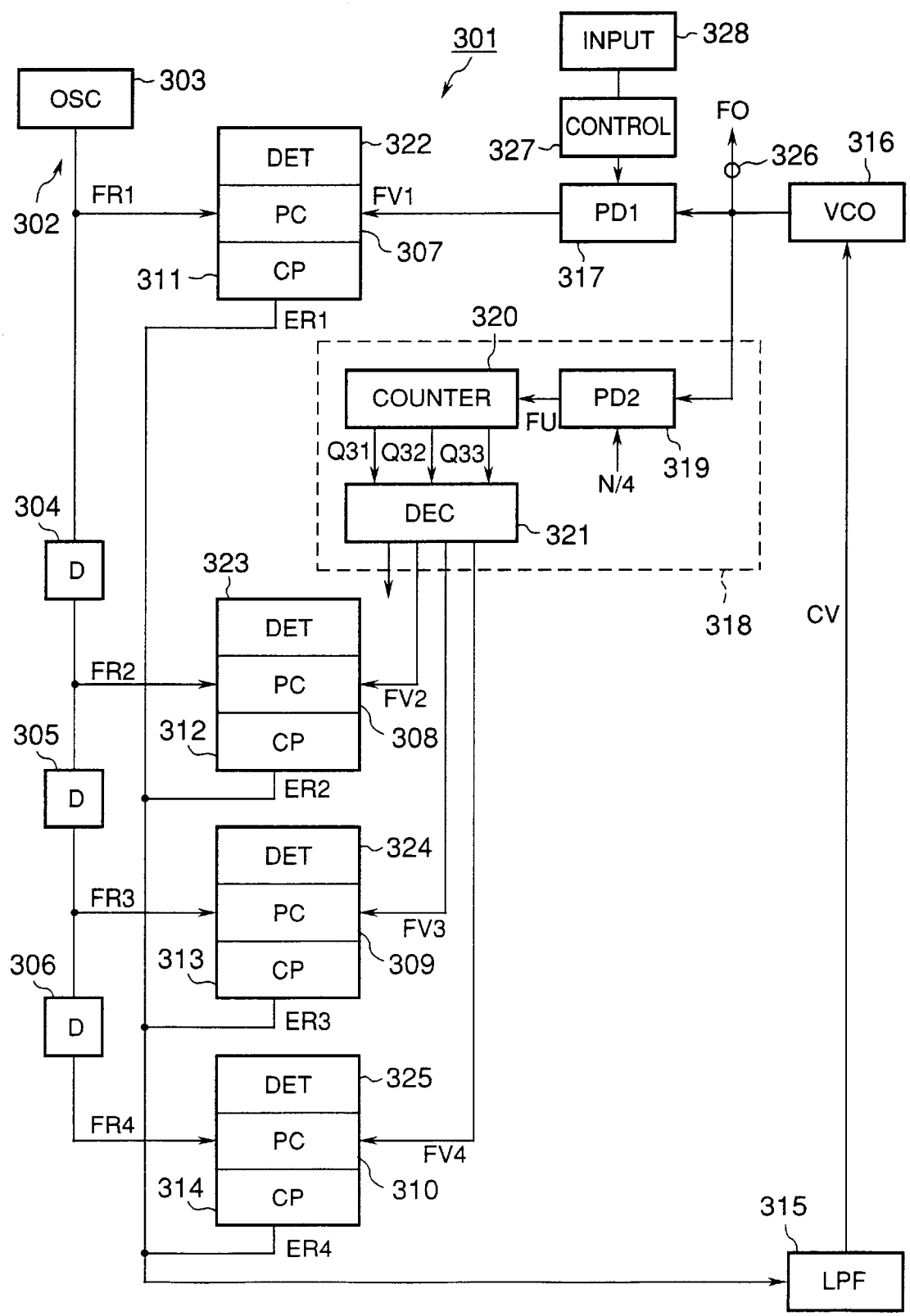
FIG. 14 is a block diagram showing a PLL device according to a sixth embodiment of the invention.
Figure 15:
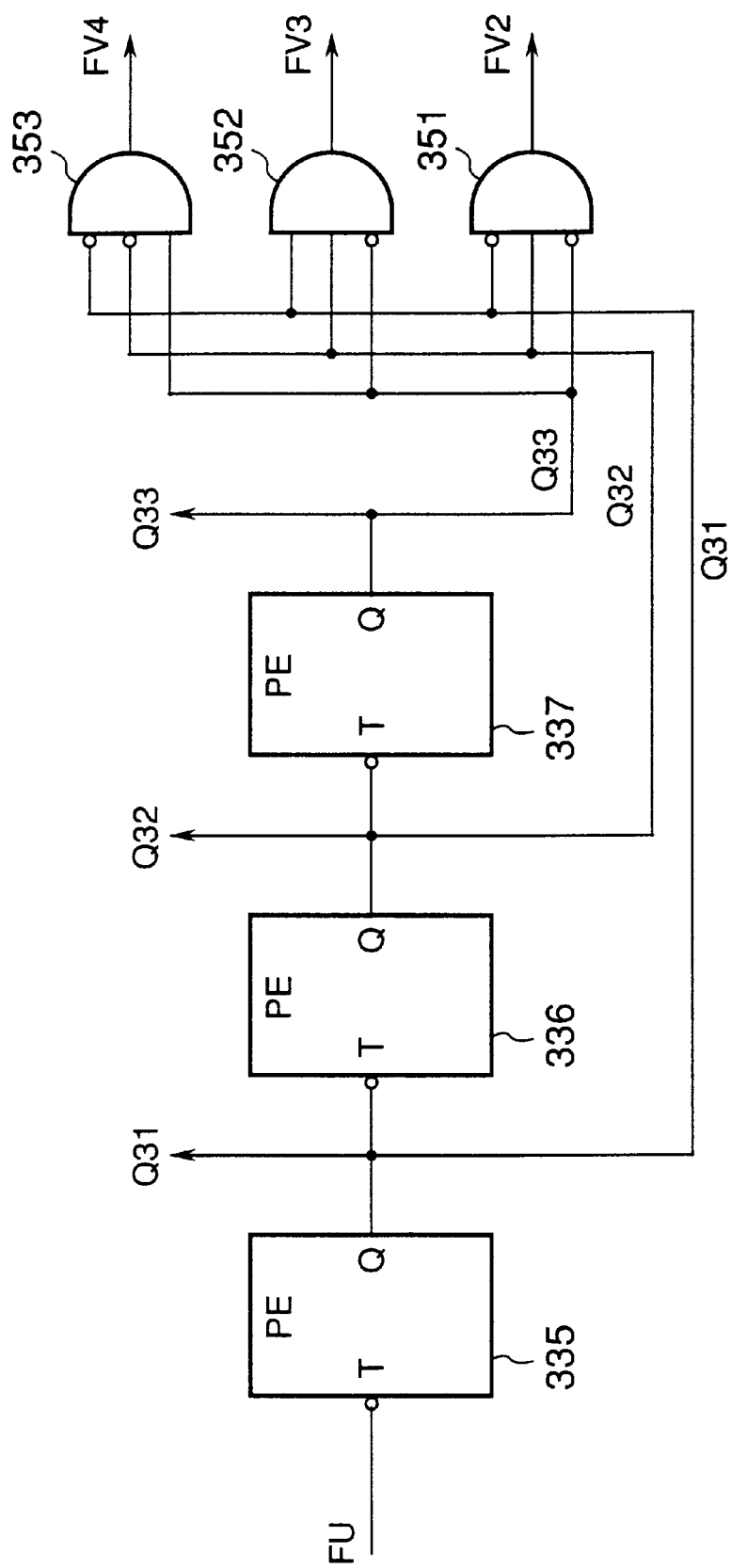
FIG. 15 is a view showing details of a counter and a decoder of the sixth embodiment.
Figure 16:
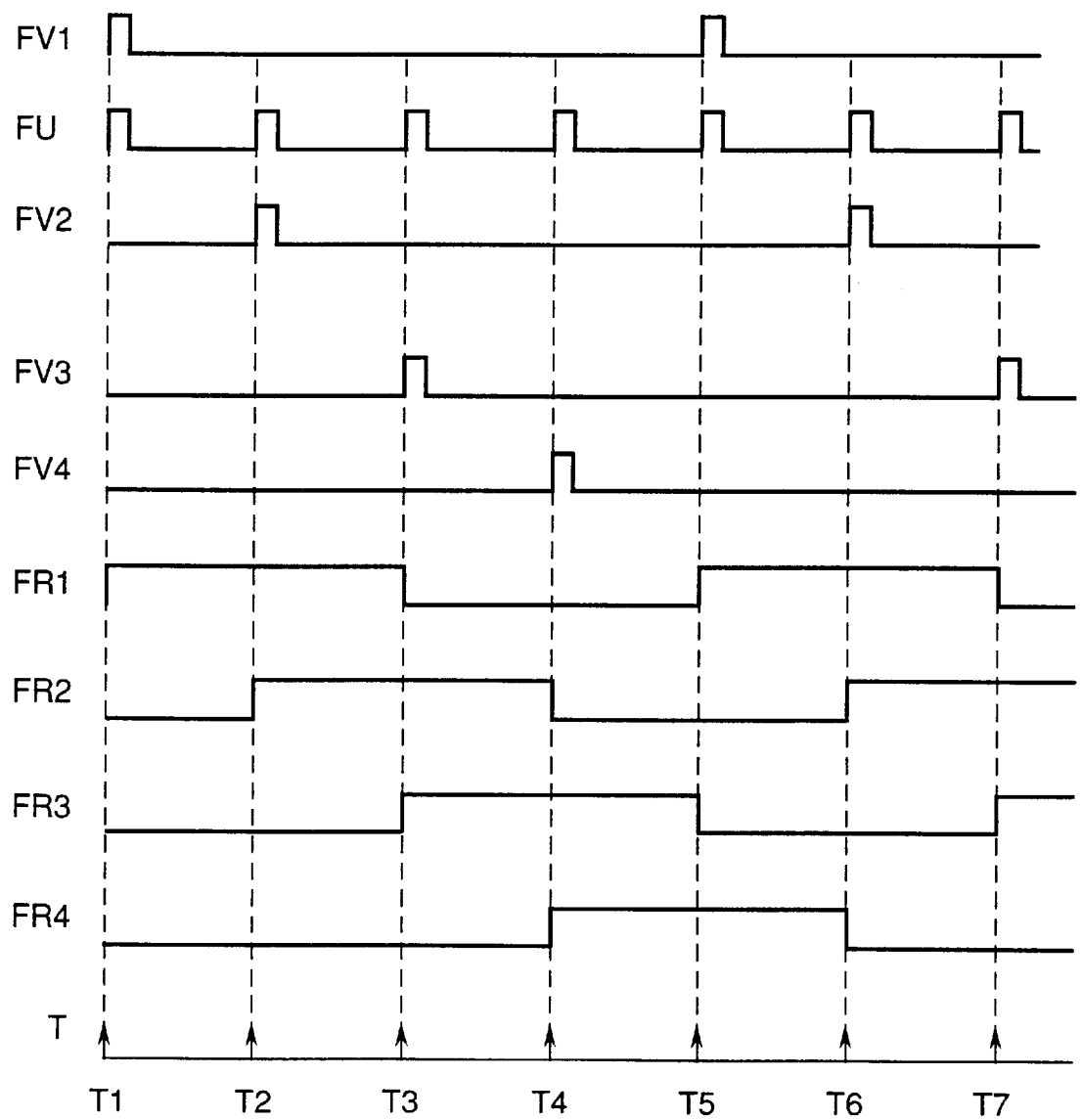
FIG. 16 is a timing diagram of signals that appear in the PLL device according to the sixth embodiment.

A PLL device 301 according to a sixth embodiment will be explained with reference to FIGS. 14, 15 and 16. FIG. 14 is a block diagram of the PLL device 301, FIG. 15 is a block diagram showing details of a counter 320 and a decoder 321 of FIG. 14, and FIG. 16 is a timing diagram of signals used in the PLL device 301.

In these Figs. a reference signal generating means 302 is comprised of a reference oscillator 303 and three delay circuits 304, 305, 306 connected in series, etc. for example. The reference oscillator 303 outputs a reference signal FR1 of 10 kHz for example. The timing diagram of FIG. 16 shows a waveform of the reference signal FR1. The reference signal FR1 rises at timings T1 and T5. The reference signal FR1 is input into one input terminal of a phase comparator 307.

The delay circuit 304 delays the reference signal FR1 by ¼ of the period of the reference signal FR1, and supplies it to a phase comparator 308 as a reference signal FR2.

The delay circuit 305 supplies a signal developed by delaying the reference signal FR1 by 2/4 period to a phase comparator 309 as a reference signal FR3. The delay circuit 306 supplies a signal developed by delaying the reference signal FR1 delayed by ¾ period to a phase comparator 310 as a reference signal FR4.

In this way, the generating means 302 generates a plurality of the reference signals FR1, FR2, FR3, FR4 having mutually differing phases. Rising points of the reference signals FR1, FR2, FR3, FR4 are shown by the timings T1, T2, T3, T4, T5, T6, T7 (see FIG. 16).

Feedback signals FV1, FV2, FV3, FV4 (described after) are input into the other input terminals of the phase comparators 307, 308, 309, 310 respectively.

The phase comparator 307 compares the phase of the feedback signal FV1 with the phase of the reference signal FR1, and outputs a phase comparison signal (pump-up signal or pump-down signal) to a charge pump 311 as a result of the comparison. The charge pump 311 outputs an error signal ER1 to a low-pass filter 315 in accordance with the phase comparison signal.

Likewise, the phase comparators 308, 309, 310 compare the phases of the feedback signals FV2, FV3, FV4 with the phases of the reference signals FR2, FR3, FR4.

The phase comparators 308, 309, 310 output phase comparison signals (pump-up signals or pump-down signals) to charge pumps 312, 313, 314 as results of the phase comparisons. The charge pumps 312, 313, 314 output error signals ER2, ER3, ER4 to the low-pass filter 315 in accordance with the phase comparison signals.

The low-pass filter 315 outputs a control voltage CV to a voltage-controlled oscillator 316 in response to the error signals ER1 to ER4. The voltage-controlled oscillator 316 outputs an output signal FO in response to the control voltage CV.

A variable frequency divider 317 has an input connected to the output of the voltage-controlled oscillator 316 and an output connected to the input of the phase comparator 307. A control unit 327 (comprised of a microcomputer etc.) sets a set frequency-division ratio N1 in the variable frequency divider 317.

With this configuration, the variable frequency divider 317 divides the output signal FO output from the voltage-controlled oscillator 316 by the set frequency-division ratio N, and delivers its output (feedback signal FV1) to the phase comparator 307. As described above, there is provided at least one variable frequency divider 317 to output the feedback signal FV1 to at least one phase comparator (phase comparator 307 in this embodiment).

A distribution means 318 is comprised of a programmable frequency divider 319, a counter 320, a decoder, etc. The programmable frequency divider 319 has an input connected to the output of the voltage-controlled oscillator 316 and an output connected to the input of the counter 320. The control unit 327 sets a set frequency-division ratio N/4 in the programmable frequency divider 319.

With this configuration, the programmable frequency divider 319 divides the output signal FO output from the voltage-controlled oscillator 316 by the set frequency-division ratio N/4, and delivers its output (intermediate signal) A to the counter 320.

The counter 320 is configured as shown in FIG. 15 for example. This counter 320 is formed by three toggle flip-flops 335, 336, 337 connected in cascade in which an intermediate signal FU is input into an input terminal of a first stage, and signals Q31, Q32, Q33 are obtained at output terminals Q of the toggle flip-flops 335, 336, 337 in stages.

The signal Q31 is a signal developed by dividing the frequency of the intermediate signal FU by two, the signal Q32 is a signal developed by dividing the frequency of the intermediate signal FU by four, and the signal Q33 is a signal developed by dividing the frequency of the intermediate signal FU by eight.

As shown in FIG. 15, the decoder 321 includes three conductors connected to the signals Q31, Q32, Q33, and a first, second, and third AND gates 351, 352, 353.

The first, second, and third AND gates 351, 352, 353 each include a first to third input terminals (some of them including input-inverting function) connected to the three conductors. The feedback signals FV2, FV3, FV4 are output from output terminals of these AND gates.

As an example, the first AND gate 351 outputs the feedback signal FV2 representing a logical AND of signals Q31-inverted, Q32, and Q33-inverted. As a result, the feedback signal FV2 has a waveform that lags from the feedback signal FV1 by ¼ of the period of the feedback signal FV1 as shown in FIG. 16.

The second AND gate 352 outputs the feedback signal FV3 representing a logical AND of the signals Q31, Q32, and Q33-inverted. As a result, the feedback signal FV3 has a waveform that lags from the feedback signal FV1 by 2/4 of the period of the feedback signal FV1 as shown in FIG. 16.

The third AND gate 353 outputs the feedback signal FV4 representing an AND of the signals Q31-inverted, Q32-inverted, and Q33. As a result, the feedback signal FV4 has a waveform that lags from the feedback signal FV1 by ¾ of the period of the feedback signal FV1 as shown in FIG. 16.

The distribution means 318 distributes the output of the variable frequency divider 317 in this manner. The phase comparators 307, 308, 309, 310 compare phases between the feedback signals FV1, FV2, FV3, FV4 output from the variable frequency divider 317 and the distribution means 318, and the reference signals FR1, FR2, FR3, FR4 to output a plurality of phase comparison signals.

In this embodiment, the distribution means 318 includes the programmable frequency divider 319 and the counter 320. However, it is permissible to configure the distribution means 318 to include either one of the programmable frequency divider 319 and the counter 320. The distribution means 318 may include more than one counter 320, if it is configured to include only the counter 320.

In this embodiment, the distribution means 318 outputs a plurality of the feedback signals FV2, FV3, FV4. The phase comparators 308, 309, 310 connected to the distribution means 318 are configured to output a plurality of phase comparison signals.

A detector, which is comprised of an AND gate, a pulse-width/voltage conversion circuit and a comparison circuit, compares, with a predetermined value, a signal that can be obtained by taking a logical AND of a pump-up signal and a pump-down signal output from the phase comparator 307 and subsequently converting it into a voltage signal, and outputs a comparison result to the control unit 327 as a detection signal. Similarly, detectors 323, 324, 325 are connected to the phase comparators 308, 309, 310. From the above elements formed is the PLL device 301.

The operation of this PLL device 301 will be described with reference to FIGS. 14 and 16. First, suppose that 1280 kHz is input into the control unit 327 through the input means 328 as a set frequency. Also suppose that the frequency of the reference signal is 10 kHz. The control unit 327 computes N=1280 kHz/10 kHz=128 (since the frequency of the reference signal is 10 kHz) as a set frequency-division ratio of the variable frequency divider 317. The control unit 327 computes a set frequency-division ratio N/4=32 of the programmable frequency divider 319. The variable frequency divider 317 divides the output signal FO by the set frequency-division ratio of 128, and outputs the feedback signal FV1 to the phase comparator 307.

The programmable frequency divider 319 divides the output signal FO by the set frequency-division ratio of 32, and outputs the intermediate signal FU. The counter 320 outputs the signals Q31, Q32, Q33 in response to the intermediate signal FU. The decoder 321 outputs the feedback signals FV2, FV3, FV4 to the phase comparators 308, 309, 310 in response to the signals Q31, Q32, Q33. As described above, the feedback signals FV2, FV3, and FV4 have waveforms in which the feedback signal FV1 is delayed by ¼, 2/4, and ¾ of the period of the feedback signal FV1 respectively.

Accordingly, the rising points of the feedback signals FV1, FV2, FV3, FV4 match the rising timings T1, T2, T3, T4, T5, T6, T7 of the reference signals FR1, FR2, FR3, FR4 (see FIG. 16).

Thus, the phase comparators 307, 308, 309, 310 compares the phases of the feedback signals FV1, FV2, FV3, FV4 with the phases of the reference signals FR1, FR2, FR3, FR4 at the timings T1, T2, T3, T4.

That is, the variable frequency divider 317, the distribution means 318, and the phase comparators 307, 308, 309, 310 are caused to operate initially to perform phase comparisons in four stages.

With this configuration, since four phase comparison are performed during one period of the reference signal, the lock-up time (the time until the output signal FO reaches approximately the set frequency) is shortened to ¼ that of the conventional type with one phase comparator stage.

The output signal FO approaches the set frequency through repetition of the phase comparisons. The decision on this is made by the detectors 322 to 325. When the detectors 322 to 325 detect that the output signal FO has reached a predetermined percentage, 70% to 95% for example, advantageously 80% to 95%, more advantageously 85% to 95% of the upper limit Dm (1.05 times the set frequency, for example) of the frequency bounds within which the state is judged as being locked, they output a signal indicative of that to the control unit 327.

The control unit 327 has the distribution means 318 and the phase comparators 308, 309, 310 stop their operations in response to this signal. At the same time, the control unit 327 has the variable frequency divider 317 and the phase comparator 307 continue their operations.

Accordingly, the phase comparator 307 compares phases between the feedback signal FV1 from the variable frequency divider 317 and the reference signal FR1, and outputs the phase comparison signal to the charge pump 311. The charge pump 311 outputs the error signal ER1 to the low-pass filter 315. The low-pass filter 315 outputs the control voltage CV to the voltage-controlled oscillator 316.

Through repetition of the phase comparisons in the loop, the PLL device 301 stably delivers the output signal FO having the set frequency of 1280 kHz to the output terminal 326 of the voltage-controlled oscillator 316, reaches the locked state, and passes this state.

Although the above explanation is for cases where a plurality of phase comparators 308, 309, 310 is provided, the present invention is not confined therein. That is, it is permissible for a single phase comparator to output a plurality of the phase comparison signals.

Figure 17:
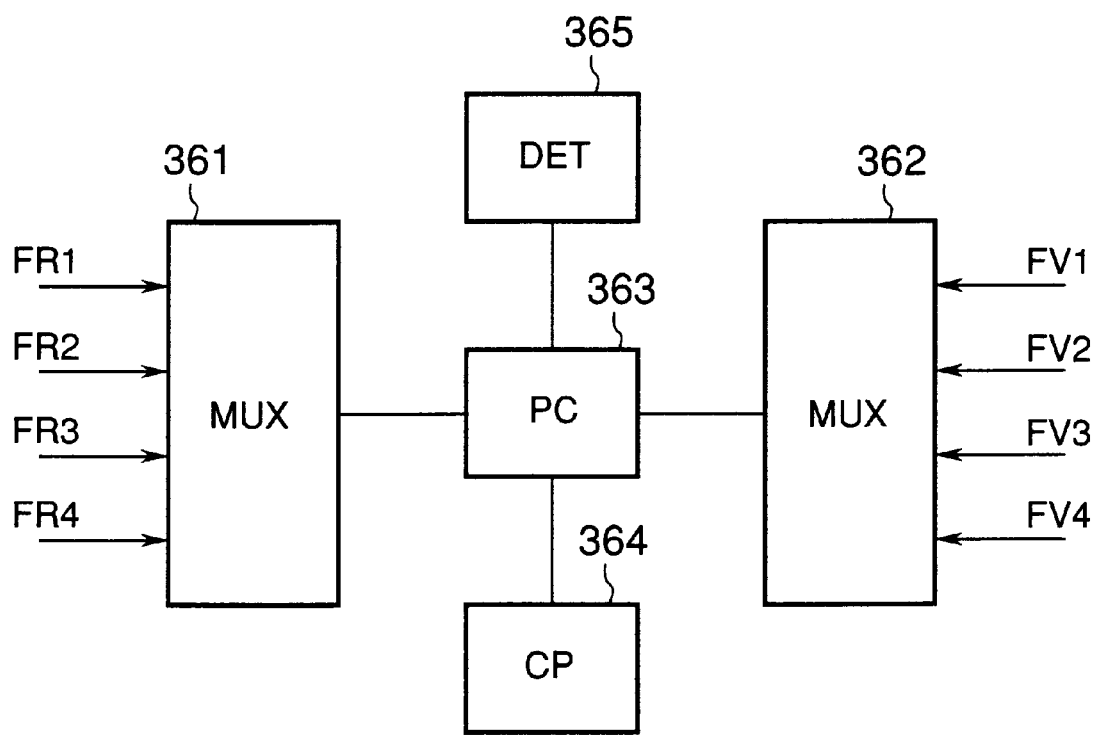
FIG. 17 is a view showing a combination of one phase comparator and a multiplexer used in place of a plurality of phase comparators of the sixth embodiment.

FIG. 17 shows an example of a configuration in which a single phase comparator outputs a plurality of the phase comparison signals. As shown in this figure, there is provided a first multiplexer 361 that selects the reference signals FR1, FR2, FR3, or FR4 sequentially, a second multiplexer 362 that selects the feedback signals FV1, FV2, FV3, or FV4 sequentially, a phase comparator 363 that compares outputs between the first and second multiplexers 361 and 362, and a charge pump 364 and a detector 365 that receive the pump-down signals and pump-up signals from the phase comparator 363. The sequential selections by the first and second multiplexers 361 and 362 are synchronized. That is, when the first multiplexer 361 selects the reference signals FR1, FR2, FR3, or FR4, the second multiplexer 362 selects the feedback signals FV1, FV2, FV3 or FV4.

With this configuration, a plurality of the phase comparison signals can be output.

Industrial Applicability

A PLL device of a first aspect of the invention includes a generating means (2, 3, 4, 5) for generating a plurality of reference signals having mutually differing phases, a plurality of variable frequency dividers (11, 12, 13, 14) that divide a frequency of an output signal of a voltage-controlled oscillator (15) to generate feedback signals, a plurality of phase comparators (7, 8, 9, 10) that compare phases between the reference signals and the feedback signals, and a control unit (30), wherein the control unit (30) allows, when deciding that a locked state has been reached in at least one of the phase comparators, this one of the phase comparators to keep on delivering an output thereof, and disables outputs of the other phase comparators.

Since the control unit allows the locked one phase comparator to keep on delivering its output and disables the outputs of the other phase comparators when deciding that the lock has been reached, it is possible to avoid interference between the outputs of a plurality of the phase comparators. So, lock is established smoothly. Furthermore, since phase comparisons are performed a plurality of times during one period of the reference signal before lock, the lock-up time is shortened.

A PLL device of a second aspect of the invention includes a generating means (2, 3, 4, 5) for generating a plurality of reference signals having mutually differing phases, a plurality of variable frequency dividers (11, 12, 13, 14) that divide a frequency of an output signal of a voltage-controlled oscillator (15) to generate feedback signals, a plurality of phase comparators (7, 8, 9, 10) that compare phases between the reference signals and the feedback signals, and a control unit (30), wherein the control unit (30) allows, when deciding that at least one of the phase comparators is in a nearly locked state, one of the phase comparators to keep on delivering an output thereof, and disables outputs of the other phase comparators.

Thus, when at least one of the phase comparators is in the nearly locked state, one of the phase comparators is allowed to keep on delivering its output, while the outputs of the other phase comparators are disabled. As a result, an excess of the output signal over a target frequency (overshoot) is reduced, and the lock-up time is shortened correspondingly.

A PLL device of a third aspect of the invention includes a generating means (2, 3, 4, 5) for generating a plurality of reference signals having mutually differing phases, a plurality of variable frequency dividers (11, 12, 13, 14) that divide a frequency an output signal of a voltage-controlled oscillator (15) to generate feedback signals, a plurality of phase comparators (7, 8, 9, 10) that compare phases between the reference signals and the feedback signals, and a control unit (30), wherein the control unit (30) allows one of the phase comparators to keep on delivering an output thereof, and disables outputs of the other phase comparators after a lapse of a predetermined time (S14) after a start signal or a frequency alteration command is input.

In this way, the phase comparators is allowed to keep on delivering its output, while outputs of the other phase comparators are disabled after a lapse of a predetermined time (S14) after the frequency alteration command or the like is input. As a result, interference between the outputs of a plurality of the phase comparators is avoided and therefore, lock is established smoothly.

In the PLL device of the first, second or third aspect, it is permissible for the control unit (30) to have the variable frequency divider connected to the phase comparator that keeps on delivering its output continue to operate, and have the other variable frequency dividers stop their operations.

Having the other variable frequency dividers stop their operations reduces the power consumed by the variable frequency dividers that have the largest power consumption of the PLL device.

The PLL device of the first or second aspect may further include detectors (37, 38, 39, 40) connected to the phase detectors for detecting the locked state or the nearly-locked state on the basis of the outputs of the phase comparators and outputting a detection signal to the control unit.

By detecting the locked state or the nearly-locked state by the detectors, it is possible to accurately set a timing at which the outputs of the other phase comparators are disabled.

A PLL device of a fourth aspect of the invention includes a generating means (2, 3, 4, 5) for generating a plurality of reference signals having mutually differing phases, a single divider or a plurality of variable frequency dividers (11, 12, 13, 14) dividing a frequency of an output signal of a voltage-controlled oscillator (15) to generate feedback signals, a single phase comparator or a plurality of phase comparators (7, 8, 9, 10) comparing phases between the reference signals and the feedback signals to output a plurality of phase comparison signals, and a control unit (30), wherein the control unit lets a plurality of the phase comparison signals be output normally, and switches to let one of the phase comparison signals be output when the state is nearly locked.

By switching from a plurality of the phase comparison signals being output to one comparison signal being output when the state is nearly locked, the previously occurring phenomenon of frequency fluctuation (lock failure) after the switching can be avoided.

In the PLL device of the fourth aspect, it is permissible to make decision that the state has been nearly locked when the frequency of the output signal has reached a predetermined percentage of the upper limit of the frequency bounds within which the state is judged as being locked after overshoots and down shoots are over.

In this case, it is advantageous to set the predetermined percentage between 70% and 95%. By doing as above, the phenomenon of lock failure and the phenomenon of interference between the outputs of the phase comparators can be avoided. As a result, a PLL device with a short lock-up time can be provided.

It is more advantageous to set the predetermined percentage between 85% and 95%. By doing as above, the lock failure phenomenon can be suppressed to the extent of causing no practical trouble.

A PLL device of a fifth aspect of the invention includes a variable frequency divider (103) that divides a frequency of an output signal of a voltage-controlled oscillator (102) to generate a feedback signal, at least one phase comparator (106) that compares phases between the feedback signal and a reference signal, a charge pump (109) that outputs an error signal (ER) in accordance with a phase comparison signal from the phase comparator, a low-pass filter (110) into which the error signal is input, and a control unit (104) that causes a current of the error signal to switch when the state is nearly locked.

With this configuration, by letting the current of the error signal large at start-up to shorten the response time of the PLL circuit, and by letting the current to switch to a small value when lock approaches, it is possible to suppress noises and power consumption. Furthermore, by switching the current of the error signal before lock, the previously occurring phenomenon of frequency fluctuation (lock failure) after the switching can be avoided.

It is permissible that the PLL device of the fifth aspect further comprises a detection means (119) for detecting the nearly locked state, and the control unit (104) causes the charge pump (109) to switch the current of the error signal when the detection means (119) detects the nearly locked state.

By performing the current switching when the detector has detected the nearly locked state, it is possible to perform the switching at an accurate timing, and thereby avoid lock failure with reliability.

In the PLL device of the fifth aspect, it is also permissible to make decision that the state has been nearly locked when the frequency of the output signal has reached a predetermined percentage of the upper limit of the frequency bounds within which the state is judged as being locked after overshoots and down shoots are over.

By doing as above, the phenomenon of lock failure and the occurrence of noises can be avoided. As a result, a PLL device with a stable and short lock-up time is provided.

In this case, it is advantageous to set the predetermined percentage between 70% and 95%.

It is more advantageous to set the predetermined percentage between 85% and 95%.

By doing as above, the lock failure phenomenon can be suppressed to the extent of causing no practical trouble.

A PLL device of a sixth aspect of the invention includes a plurality of frequency dividing units (230, 231, 260) that divide a frequency of an output signal of a voltage-controlled oscillator (229) to generate feedback signals (fv1 to fv8), a plurality of phase comparators (212 to 219) that compare phases between the feedback signals (fv1 to fv8) and the reference signals (fR1 to fR8) to output error signals (ER1 to ER8) through charge pumps (221 to 228), a low-pass filter (221) that converts the error signals (ER1 to ER8) into a control voltage (CV) to be output to the voltage-controlled oscillator (229), and a control unit (258), wherein the control unit (258) is capable of causing the phase comparators to deliver outputs or to disable outputs of the phase comparators, and of altering a time constant of the low-pass filter depending on the number of the phase comparators that are caused to deliver outputs.

With this configuration, when the number of the phase comparators to deliver their outputs is determined, an optimum time constant can be automatically determined in conformity with this number. Since an optimum frequency and damping factor are obtained depending on the number of the phase comparators (number of stages) by this time constant, the stability of the PLL device becomes sufficient, and the converging speed is increased as well In the PLL device of the sixth aspect, it is permissible for the control unit to cause the frequency dividing unit connected to the phase comparator that is delivering its output to operate, and causes the other frequency dividing units to stop their operations.

By stopping the frequency dividing units other than the one connected to the phase comparator that keeps on delivering its output, the number of the frequency dividing units in operation having a large power consumption can be reduced. Accordingly, the overall power consumption of the PLL device is reduced.

It is also permissible for the control unit to have all of the phase comparators deliver their outputs until the PLL device is locked, and have some of the phase comparators deliver their outputs after lock.

By having all of the phase comparators deliver their outputs before lock, the lock-up time is shortened since the number of the phase comparisons increases. Furthermore, since the outputs of some of the phase comparators are disabled after lock, interference between the outputs of a plurality of the phase comparators is avoided. Therefore, lock is established smoothly and the lock-up time is shortened.

It is also permissible to alter the cut-off frequency of the low-pass filter when the control unit alters the time constant.

With this configuration, an optimum cut-off frequency can be obtained depending on the number (the number of stages) of the phase comparators in operation.

It is also permissible that a reference signal generating means capable of generating a plurality of reference signals having mutually differing phases and of selecting the number of the reference signals to be generated is provided, and the control unit determines the cut-off frequency following the selection of the number of the reference signals to be subjected to the phase comparisons.

With this configuration, although the frequency of the error signals vary depending on the number of the reference signals to be subjected to the phase comparisons, it is possible to bring the cut-off frequency close to this frequency. As a result, the low-pass filter can perform an optimum cut-off operation.

It is also permissible to configure the low-pass filter to alter its gain when the control unit alters the time constant.

With this configuration, the product of the gain due to the phase comparators and the gain of the low-pass filter (that is, the overall gain of the PLL loop) can be maintained at the same optimum value irrespective of the number of the phase comparators in operation or the number of stages (for example, in the case of one stage or in the case of eight stages).

A PLL device of a seventh aspect of the invention includes a generating means (302, 304, 305, 306) for generating a plurality of reference signals having mutually differing phases, a variable frequency divider (317) that divides a frequency of an output signal of a voltage-controlled oscillator (316) a distribution means (318) for distributing the output of the voltage-controlled oscillator (316), and phase comparators (307 to 310) that compares phases between feedback signal (FV1 to FV4) output from the variable frequency divider (317) and the distribution means (318) and the reference signal (FR1 to FR4), and output a plurality of phase comparison signals.

With this configuration, a plurality of the reference signals having different phases are compared with the feedback signals, and therefore, the phase comparisons are performed multiple times during one period of the reference signal whereby the lock-up time is shortened. Furthermore, only the variable frequency divider and the distribution means divide the output signal, so it is not necessary to have as many frequency dividers as there are phase comparators as previously. Accordingly, the cost is low, LSI implementation is easy, and the amount of power consumed is small.

Furthermore, since the distribution means distributes the output of the voltage-controlled oscillator, the feedback signals output from the variable frequency divider and the feedback signals output from the distribution means are output at timings in synchronism with rising (or falling) points of a plurality of the phase comparators, whereby accurate phase comparisons can be performed.

In the PLL device of the seventh aspect, it is permissible that the distribution means (318) includes a counter (320) and/or a programmable frequency divider (319).

In this configuration, only the variable frequency divider, and the counter and/or the programmable frequency divider output a plurality of the feedback signals, so it is not necessary to have variable frequency dividers used previously for outputting the feedback signals individually. As a result, the space taken up by these elements is small and therefore, LSI implementation becomes easy.

It is permissible that at least one variable frequency divider (319) and at least one counter (320) are provided.

With this configuration, by having variable frequency divider and the counter operate initially to perform the phase comparisons multiple times during one period of the reference signal, the lock-up time is shortened. By having only the variable frequency divider operate when lock is approaching, it is possible to perform the phase comparisons accurately so that the output signal has the set frequency accurately. Furthermore, since the counter takes up less space than the variable frequency divider and is low in cost, the PLL device becomes space-saving and low in cost as a whole.

It is also permissible that the distribution means (318) outputs a plurality of the feedback signals (FR2 to FR4), and the phase comparators (308 to 310) connected to the distribution means output a plurality of the phase comparison signals (ER2 to ER4).

By having one distribution means output a plurality of the feedback signals, it becomes unnecessary to have variable frequency dividers for outputting the feedback signals individually and accordingly space-saving and low cost are achieved. Furthermore, since the phase comparators output a plurality of the phase comparison signals, the lock-up time is shortened.

It is also permissible to have the variable frequency divider and the distribution means operate initially, and allow only the variable frequency divider to keep on operating when lock is approaching.

By having the variable frequency divider and the distribution means operate initially to output a plurality of feedback signals so that a plurality of the phase comparison signals are output through phase comparisons, the lock-up time is shortened as described above. Moreover, since only the variable frequency divider is allowed to keep operating, while the distribution means and the phase comparators connected to the distribution means are stopped when lock approaches, power consumption is small. As a result, in any portable including the PLL device (cellular phone, for example), built-in batteries can be used for a long time.

What is claimed is:

1. A PLL device comprising:
a generating means (2, 3, 4, 5) for generating a plurality of reference signals having different phases;
a plurality of variable frequency dividers (11, 12, 13, 14) that divide a frequency of an output signal of a voltage-controlled oscillator (15) and output feedback signals;
a plurality of phase comparators (7, 8, 9, 10) that compare phases between the reference signals and the output feedback signals; and
a control unit (30);
wherein
the control unit (30), upon deciding that a locked state has been reached in at least one of the phase comparators, allows said one of the phase comparators to keep on delivering an output, and disables outputs of the other phase comparators, and
the control unit (30) causes the variable frequency divider connected to the phase comparator that keeps on delivering an output to continue to operate, and stops operations of the other frequency dividers;
further comprising detectors (37, 38, 39, 40) connected to the phase comparators respectively for detecting a locked state or a nearly locked state on the basis of outputs of the phase comparators and outputting a detection signal to the control unit, wherein the control unit decides that the locked state is reached when the frequency of the output signal reaches a predetermined percentage between 70% and 95% of an upper limit of frequency bounds after overshoots and down shoots are over.

2. A PLL device comprising:
a generating means (2, 3, 4, 5) for generating a plurality of reference signals having different phases;
a plurality of variable frequency dividers (11, 12, 13, 14) that divide a frequency of an output signal of a voltage-controlled oscillator (15) and output feedback signals;

a plurality of phase comparators (7, 8, 9, 10) that compare phases between the reference signals and the feedback signals; and a control unit (30);

wherein the control unit (30), upon deciding that a nearly locked state has been reached in at least one of the phase comparators, allows any one of the phase comparators to keep on delivering an output, and disables outputs of the other phase comparators and the control unit (30) causes the variable frequency divider connected to the phase comparator that keeps on delivering an output to continue to operate, and stops operations of the other frequency dividers; further comprising detectors (37, 38, 39, 40) connected to the phase comparators respectively for detecting a locked state or a nearly locked state on the basis of outputs of the phase comparators and outputting a detection signal to the control unit, wherein the control unit decides that the locked state is reached when the frequency of the output signal reaches a predetermined percentage between 70% and 95% of an upper limit of frequency bounds after overshoots and down shoots are over.

3. A PLL device comprising:

a generating means (2, 3, 4, 5) for generating a plurality of reference signals having different phases;

a plurality of variable frequency dividers (11, 12, 13, 14) for dividing a frequency of an output signal of a voltage-controlled oscillator (15) and outputting feedback signals;

a plurality of phase comparators (7, 8, 9, 10) for comparing phases between the reference signals and the feedback signals and outputting a plurality of phase comparison signals; and a control unit (30);

wherein the control unit lets normally a plurality of the phase comparison signals be output, and switches to let only one of the phase comparison signals be output after a nearly locked state is reached, and the control unit decides that the nearly locked state is reached when the frequency of the output signal reaches a predetermined percentage of an upper limit of frequency bounds within which the output signal is judged as being in a locked state after overshoots and down shoots are over; in which the predetermined percentage is between 70% and 95%.

4. A PLL device according to claim 3, in which the predetermined percentage is between 85% and 95%.

5. A PLL device comprising:

a variable frequency divider (103) that divides a frequency of an output signal of a voltage-controlled oscillator (102) and outputs a feedback signal;

at least one phase comparator (106) for comparing phases between the feedback signal and a reference signal;

a charge pump (109) for outputting an error signal (ER) in accordance with a phase comparison signal from the phase comparator;

a low-pass filter (110) to which the error signal is input; and a control unit (104) that has a current of the error signal switched when a nearly locked state is reached;

wherein the control unit decides that the nearly locked state is reached when the frequency of the output signal reaches a predetermined percentage of an upper limit of frequency bounds within which the output signal is judged as being in a locked state after overshoots and down shoots are over; in which the predetermined percentage is between 70% and 95%.

6. A PLL device according to claim 5, in which the predetermined percentage is between 85% and 95%.

7. A PLL device comprising:

a plurality of frequency dividing units (230, 231, 260) for dividing a frequency of an output signal of a voltage-controlled oscillator (229) to output feedback signals (fv1 to fv8);

a plurality of phase comparators (212 to 219) for comparing phases between the feedback signals (fv1 to fv8) and reference signals (fR1 to fR8) and outputting error signals (ER1 to ER8) through charge pumps (221 to 228) respectively;

a low-pass filter (221) for converting the error signals (ER1 to ER8) into a control voltage (CV) to be output to the voltage-controlled oscillator (229); and a control unit (258);

wherein the control unit (258) is capable of causing the phase comparators to deliver outputs or to disable outputs, and alters a time constant of the low-pass filter depending on the number of the phase comparators that are caused to deliver outputs, and the control unit (30) causes the variable frequency divider connected to the phase comparator that is delivering an output to operate, and stops operations of the other frequency dividers; in which the control unit alters a cut-off frequency of the low-pass filter at the time of altering the time constant.

8. A PLL device according to claim 7, further comprising a reference signal generating means capable of generating a plurality of reference signals having different phases and of selecting the number of the reference signals to be generated, the control unit determining the cut-off frequency following selection of the number of the reference signals to be subjected to phase comparison.

9. A PLL device comprising:

a plurality of frequency dividing units (230, 231, 260) for dividing a frequency of an output signal of a voltage-controlled oscillator (229) to output feedback signals (fv1 to fv8 );

a plurality of phase comparators (212 to 219) for comparing phases between the feedback signals (fv1 to fv8) and reference signals (fR1 to fR8) and outputting error signals (ER1 to ER8) through charge pumps (221 to 228) respectively;

a low-pass filter (221) for converting the error signals (ER1 to ER8) into a control voltage (CV) to be output to the voltage-controlled oscillator (229); and a control unit (258);

wherein the control unit (258) is capable of causing the phase comparators to deliver outputs or to disable outputs, and alters a time constant of the low-pass filter depending on the number of the phase comparators that are caused to deliver outputs, and the control unit (30) causes the variable frequency divider connected to the phase comparator that is delivering an output to operate, and stops operations of the other frequency dividers; in which the control unit alters a gain of the low-pass filter at the time of altering the time constant.

10. A PLL device comprising: a generating means (302, 304, 305, 306) for generating a plurality of reference signals having different phases;
   a variable frequency divider (317) for dividing a frequency of an output signal of a voltage-controlled oscillator (316);
   a distribution means (318) for distributing the output of the voltage-controlled oscillator (316); and
   phase comparators (307 to 310) for comparing phases between feedback signals (FV1 to FV4) output from the variable frequency divider (317) and the distribution means (318) and the reference signals (FR1 to FR4) to output a plurality of phase comparison signals;
   wherein the variable frequency divider and the distribution means are caused to operate initially, while only the variable frequency divider is allowed to keep on operating when lock is approaching.

11. A PLL device according to claim 10, in which the distribution means (318) includes a counter (320) and/or a programmable frequency divider (319).

12. A PLL device according to claim 11, in which at least one programmable frequency divider (319) and at least one counter (320) are provided.

13. A PLL device according to claim 10, in which the distribution means (318) outputs a plurality of the feedback signals (FV1 to FV4), the phase comparators (308 to 310) connected to the distribution means output a plurality of the phase comparison signals (ER2 to ER4).

* * * * *